(12) United States Patent
Nishizawa et al.

(10) Patent No.: US 7,341,198 B2
(45) Date of Patent: Mar. 11, 2008

(54) IC CARD AND A METHOD OF MANUFACTURING THE SAME

(75) Inventors: Hirotaka Nishizawa, Tokyo (JP); Junichiro Osako, Tokyo (JP); Kenji Osawa, Tokyo (JP); Tamaki Wada, Tokyo (JP); Michiaki Sugiyama, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 8 days.

(21) Appl. No.: 10/588,301

(22) PCT Filed: Feb. 20, 2004

(86) PCT No.: PCT/JP2004/002003

§ 371 (c)(1),
(2), (4) Date: Aug. 2, 2006

(87) PCT Pub. No.: WO2005/081181

PCT Pub. Date: Sep. 1, 2005

(65) Prior Publication Data

US 2007/0125866 A1  Jun. 7, 2007

(51) Int. Cl.
*G06K 19/06* (2006.01)
(52) U.S. Cl. .................. 235/492; 235/487; 235/486; 235/441
(58) Field of Classification Search ............... 235/441, 235/486, 487, 492
See application file for complete search history.

(56) References Cited

U.S. PATENT DOCUMENTS

| | | | | |
|---|---|---|---|---|
| 5,362,955 A | * | 11/1994 | Haghiri-Tehrani | 235/492 |
| 5,581,065 A | * | 12/1996 | Nishikawa et al. | 235/492 |
| 6,448,638 B1 | * | 9/2002 | Fidalgo et al. | 257/679 |
| 6,685,097 B1 | * | 2/2004 | Housse | 235/492 |
| 6,722,571 B1 | * | 4/2004 | Lavrut et al. | 235/492 |
| 6,776,347 B2 | * | 8/2004 | Nishikawa et al. | 235/492 |
| 6,964,377 B1 | * | 11/2005 | Haghiri et al. | 235/492 |
| 7,086,601 B2 | * | 8/2006 | Dhers et al. | 235/492 |
| 2005/0252978 A1 | * | 11/2005 | Nishizawa et al. | 235/492 |
| 2007/0176007 A1 | * | 8/2007 | Priya et al. | 235/492 |

FOREIGN PATENT DOCUMENTS

JP  2000-094874 A  4/2000

(Continued)

*Primary Examiner*—Uyen-Chau N Le
(74) *Attorney, Agent, or Firm*—Miles & Stockbridge PC

(57) ABSTRACT

An IC card 1CD includes a frame member portion 1CB1, and an IC card main body 15 held in a state of being hung by a connecting portion 1CB2 in a frame thereof. The IC card main body 15 is made to constitute a card type information medium having a high functional performance having both of a function as a so-to-speak IC card and a function as a so-to-speak memory card having a capacity larger than that of the IC card and a function higher than that of the IC card capable of executing a security processing. An outer shape of the IC card main body 15 is formed in compliance with RS-MMC outer shape standard. A surface of a cap portion 1CB3 of the IC card main body 15 is printed with a desired character, pattern, diagram and photograph or the like by a printing method used in steps of fabricating a general IC card, and the IC card 15 is provided with higher acknowledgement performance, security performance and outlook.

17 Claims, 38 Drawing Sheets

FOREIGN PATENT DOCUMENTS

| | | |
|---|---|---|
| JP | 2001-092255 A | 4/2001 |
| JP | 2001-357376 A | 12/2001 |
| JP | 2002-123807 A | 4/2002 |
| JP | 2003-022430 A | 1/2003 |
| JP | 2003-154778 A | 5/2003 |
| JP | 2003-159753 A | 6/2003 |
| JP | 2003-242475 A | 8/2003 |
| JP | 2003-296688 A | 10/2003 |
| WO | WO 02/099742 A1 | 12/2002 |

\* cited by examiner

US 7,341,198 B2

IC CARD AND A METHOD OF MANUFACTURING THE SAME

TECHNICAL FIELD

The present invention relates to a technology which is effective by being applied to a method of fabricating an IC card and an IC card technology.

BACKGROUND ART

Card type information media of an IC card, a memory card and the like are small-sized, thin and light-weighted and therefore, excellent in portability, transportability and convenience and spreading thereof has been promoted in various fields.

IC cards are card type information media each of which is embedded with an IC chip in a plastic-made thin plate of a cash card size to be able to record information and spreading thereof has been promoted in fields requesting high security performance of finance, transportation, communication, distribution and acknowledgement and the like as in, for example, a credit card, a cash card, a card for a system of ETC (Electronic Toll Collection system), a commutation pass, a card for a portable telephone or an acknowledgement card or the like from reason of being excellent in acknowledgement performance and tamperproof.

With regard to an IC card, there is disclosed a constitution of fixing an SIM (Subscriber Identify Module) type card by providing a bridge at an opening portion of a frame card in, for example, FIG. 9 of JP-A-2001-357376. Further, there is disclosed a constitution of forming a recess portion on one side face of an IC carrier, or forming an opening portion penetrating both faces of an IC carrier in, for example, JP-A-2002-123807. Further, there is disclosed an IC card including a pattern, an embossment, a hologram film or a magnetic recording layer on a surface of a card case member in, for example, JP-A-2003-154778. Further, there is disclosed a method of printing an IC card in, for example, JP-A-2001-92255.

On the other hand, the above-described memory cards have been spread as record media of portable type information apparatus requesting transportability as in, for example, a digital camera, a notebook type personal computer, a portable type music player, a portable telephone and the like since the memory cards are small-sized more than IC cards and are easy to write and read a large capacity of information at high speed. As representative memory card standards, there are an SD (Secure Digital) memory card (there is a standard rectified by SD card society), a mini SD, MMC (Multi Media Card, which is a registered trademark of Infine on Technologies AG), RS-MMC (Reduced Size MMC) and the like.

With regard to the memory card, there is a description in, for example, International Patent Publication No. WO 02/099742A1, disclosing a constitution of a memory card including a flash memory chip, an IC card chip capable of executing a security processing, and a controller chip for controlling circuit operation of the chips with an object of promoting security performance.

Meanwhile, the inventors have investigated to achieve promotion of a function of an IC card by combining a function of an IC card and a function of a memory card. As a result, it has been found that it is an important problem how to make a constitution particular to a memory card, for example, an outer shape, a pin arrangement or an interface constitution or the like in an IC card.

It is an object of the invention to provide a technology capable of promoting a function of an IC card.

The above-described as well as other objects and a novel characteristic of the invention will become apparent from a description and attached drawings of the specification.

DISCLOSURE OF THE INVENTION

An outline of a representative one of the invention disclosed in the application will simply be explained as follows.

That is, the invention comprises (a) a step of preparing a card board printed with first information at a first main face, a second main face on an opposed side thereof or the two main faces of a card region, (b) a step of forming a recess portion at the first main face of the card region, (c) a step of forming a recess portion at the second main face of the card region, (d) a step of cutting out the card region from the card board, (e) a step of fitting to fix an IC portion including an IC chip having a memory function, a calculating function, and a control function to the recess portion formed at a cap portion of the first main face of the card region, (f) a step of writing a desired data to the IC chip, and (g) a step of forming an opening portion penetrating the first main face and the second main face of the card board at a portion of the card board at a surrounding of the cap portion such that the cap portion is held in a state of being hung by the card board by way of a connecting portion.

BEST MODE FOR CARRYING OUT THE INVENTION

Embodiments of the invention will be explained in details in reference to the drawings as follows. Further, in all of the drawings for explaining the embodiments, portions having the same functions are attached with the same notations and a repeated explanation thereof will be omitted.

Embodiment 1

An explanation will be given of an example of a method of fabricating an IC (Integrated Circuit) card of Embodiment 1 in reference to FIG. 2 through FIG. 28 in line with a flowchart of steps of FIG. 1.

Figure 2:
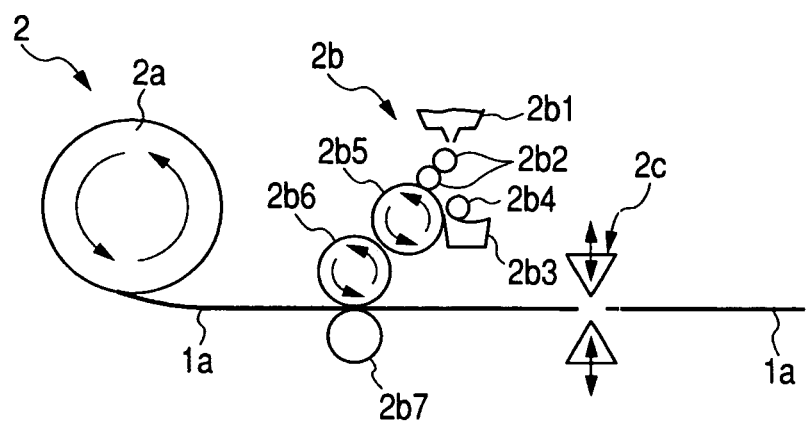
FIG. 2 is an explanatory view of a printing step constituting a step of fabricating an IC card according to an embodiment of the invention.

First, a card board is prepared (step 100). The card board is formed, for example, as follows. First, as shown by FIG. 2, common information (first information) is printed to a printing sheet 1a (step 100a). The printing sheet 1a comprises a plastic of, for example, polyvinyl chloride (PVC), polycarbonate, polyolefin (polypropylene or the like), poly ethylene terephathalate: PET), poly ethylene terephthalate glycol (PET-G) or the like. Cost of the IC card can be reduced by using such a comparatively inexpensive plastic. Further, when polycarbonate is used, a clear drawn image can be printed by a laser drawing method. Further, when polypropylene, PET or PET-G is incinerated, hydrogen chloride gas is not generated and therefore, a burden on an environment can further be alleviated. Further, PET-G can be melted at low temperatures to achieve an advantage of molding to melt together without interposing an adhering agent. A thickness of the printing sheet 1a is, for example, about 0.2 mm and the printing sheet 1a having a high flatness is used to be easy to be printed. The common information printed on the printing sheet 1a is information common to a plurality of IC cards, for example, a company name of a company issuing the card, a kind of a card, and the like, otherwise, a common character, a pattern or a diagram or the like.

As a printing method, for example, offset printing is adopted. Offset printing is a kind of a lithography and is a method for producing a portion on a block plate having chemical affinity with an oil based ink and transcribing the oil based ink by utilizing a property in which water and the oil based ink repell with each other. Specifically, for example, the method is as follows. First, the printing sheet 1a reeled in a roll-like shape by a reeling portion 2a of a printing machine 2 is supplied from the reeling portion 2a to a printing portion 2b. The printing portion 2b is arranged with an ink supply portion 2b1, an ink roller 2b2, a water vessel 2b3, a water roller 2b4, a plate block 2b5, a blanket 2b6, an impression cylinder 2b7 and the like. A surface of the plate block 2b5 is previously formed with a hydrophilic portion based on a draft of an object of printing. At the printing portion 2b, wetting water at inside of the water vessel 2b3 is coated on a side of the plate block 2b5 by way of the water roller 2b4, and the oil based ink is coated on the side of the plate block 2b5 by way of the ink roller 2b2. Then, the wetting water is adhered to the hydrophilic portion of the plate block 2b5 and the oil based ink is adhered to a nonhydrophlic portion thereof. The oil based ink adhered to the plate block 2b5 is transcribed onto the blanket 2b6 comprising rubber or the like, and the oil based ink adhered to the blanket 2b6 is printed to the printing sheet 1a. In the case of the offset printing, even a fine draw line can excellently be printed. Further, a number of the same blocks can easily be made. Further, a printing speed is fast and therefore, delivery time can be shortened. Further, time and labor of plate making is reduced and therefore, printing by a large amount can be carried out, and plate making cost is the most inexpensive and therefore, cost of the IC card can be reduced. Although in FIG. 2, there is exemplified the offset rotary press printing for continuously printing a desired pattern or the like on the printing sheet 1a reeled in the roll-like shape, the method is not limited thereto but, for example, there may be adopted offset sheet printing for printing a desired pattern on a plurality of sheets of printing sheets cut in, for example, a rectangular shape sheet by sheet. Further, there may be adopted a relief printing (typography) for executing printing by adhering ink to a projected portion of a block plate attached with recesses and projections. In the case of relief printing, strong printing having a clear character or line can be executed. Further, screen printing of silk printing or the like can also be used.

Figure 3:
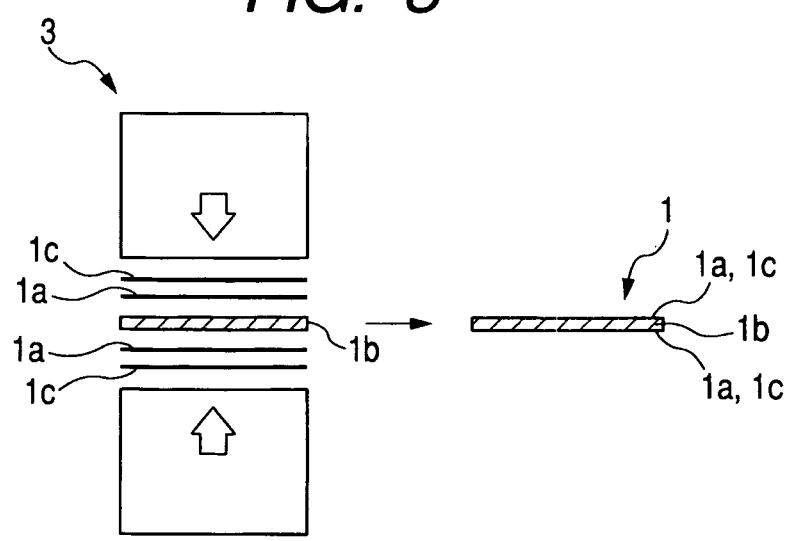
FIG. 3 is an explanatory view of a press-contacting step constituting a step of fabricating an IC card according to an embodiment of the invention.

Successively, the printing sheet 1a subjected to the printing processing is cut for respective unit regions by a sheet cutting portion 2c (step 100b). A plane dimension of the unit region is, for example, about 1 m×1 m. Successively, as shown by FIG. 3, in a state of successively laminating the printing sheets 1a and cover sheets 1c on both main faces of a first main face of a card base member 1b and a second main face on a back side thereof, by thermally pressing these by a pressing machine 3, a card board 1 is formed (step 100c). In the thermal pressing step, respective layers of the card base member 1b, the printing sheets 1a and the cover sheets 1c can also be melted to weld, further can also be adhered to each other by interposing an adhering member therebetween. The card board 1 is a plastic flat plate having a plane dimension of, for example, about 1 m×1 m, and a thickness of, for example, about 1.4 mm. The card base member 1b is a core portion of the card board 1 and is provided with a function of adjusting a thickness, a strength or the like of the card board 1. In order to provide the card board 1 with a sufficient thickness, a plurality of sheets of the card boards 1 can be laminated to be used. A material of the card base member 1b is the same as that of the printing sheet 1a. When the card base member 1b is formed by PET, by forming the printing sheet 1a by PET-G having a high force of adhering to PET, an adhering force by melting to weld the card base member 1b and the printing sheet 1a can be increased and therefore, reliability and service life of the IC card can be promoted. The card base member 1b is brought into a state of being harder than the printing sheet 1a and the cover sheet 1c. Thereby, when a recess portion is formed at the card board 1 as mentioned later, a machining processing can be promoted in a stable state. Further, a controllability of a shape of a recess when the recess is formed at the card base member 1b can be promoted and a dimensional accuracy of the recess can be improved. The cover sheet 1c is a sheet pressed to a surface on the outermost side of the card board 1 and is provided with a function of protecting a surface of the IC card. In a state of pasting information means of a hologram film or the like on a surface of the cover sheet 1c, the pressing processing can also be carried out. A material of the cover sheet 1c is the same as that of the printing sheet 1a.

Figure 4:
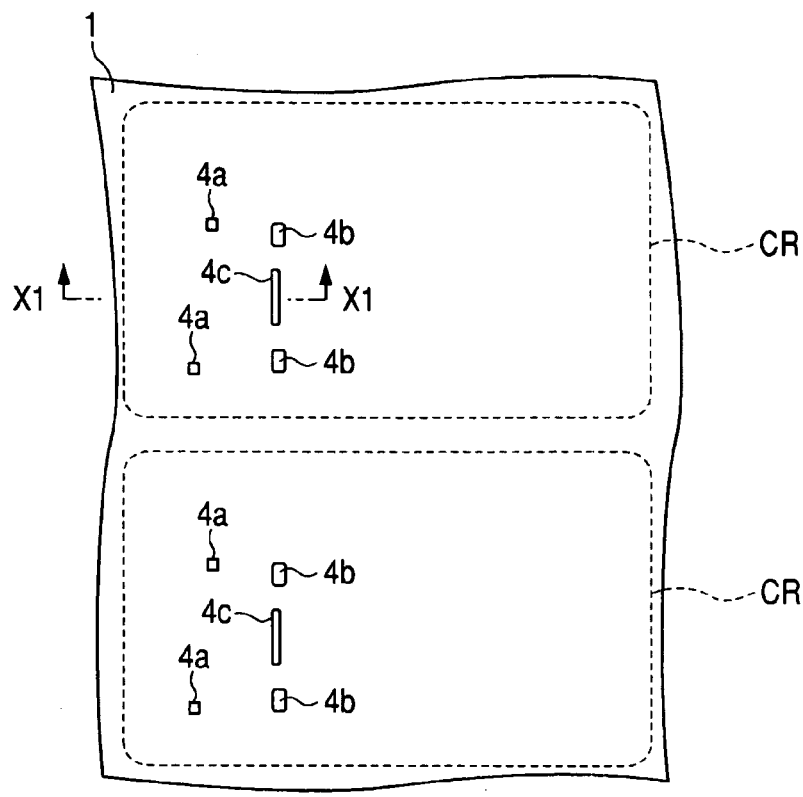
FIG. 4 is a plane view of an essential portion of a card board in steps of fabricating an IC card according to an embodiment of the invention.
Figure 5:
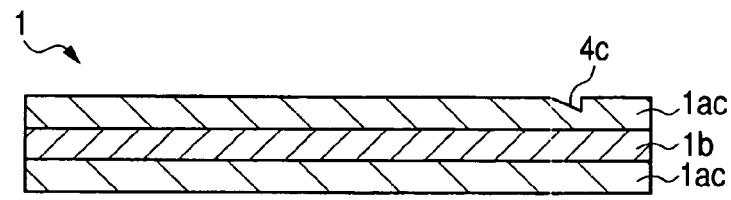
FIG. 5 is an enlarged sectional view taken along a line X1-X1 of FIG. 4.

Next, the card board 1 is subjected to a cutting processing by using a numerical control (NC) machine tool or the like (step 101). Here, recess portions are formed at both main faces of a first main face of the card board 1 and a second main face on an opposed side thereof (step 101a1). As shown by FIG. 4 and FIG. 5, recess portions 4a through 4c are formed by milling (milling) using, for example, an end mill for respective card regions CR of the first main face of the card board 1 (step 101a1). FIG. 4 shows a plane view of an essential portion of the first main face of the card board 1. Here, as shown by broken lines, two of the card regions CR are shown. Further, FIG. 5 shows an enlarged sectional view taken along a line X1-X1 of FIG. 4. Notation 1ac designates a portion of laminating the printing sheet 1a and the cover sheet 1c. The recess portion 4a is a notch portion for preventing a main body of the IC card from drawing out from a desired electronic apparatus against intension, the recess portion 4b is a flange portion fitted to a card adapter, mentioned later, the recess portion 4c is a portion caught when the main body of the IC card is taken out from a desired electronic apparatus or the like.

Figure 6:
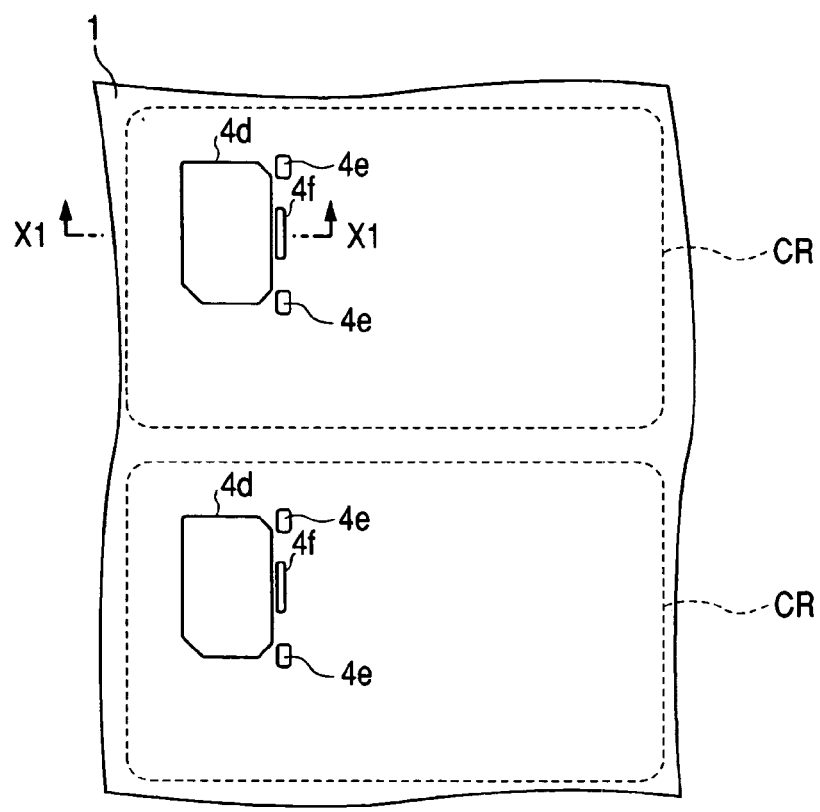
FIG. 6 is a plane view of an essential portion of a card board in a step of fabricating an IC card continued from FIG. 4.
Figure 7:
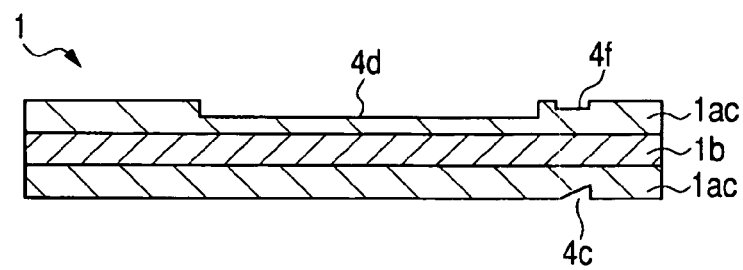
FIG. 7 is an enlarged sectional view taken along a line X1-X1 of FIG. 6.

Successively, after finishing to machine all the card regions CR of the first main face of the card board 1, the card board 1 is turned back, as shown by FIG. 6 and FIG. 7, shallow recess portions 4d through 4f are formed by, for example, milling similar to the above-described for respective card regions CR of the second main face of the card board 1. FIG. 6 shows a plane view of an essential portion of the second main face of the card board 1 of FIG. 4, FIG. 7 shows an enlarged sectional view taken along a line X1-X1 of FIG. 6, respectively. The recess portion 4d is a cavity portion of a wiring board of an IC portion, mentioned later, the recess portion 4e is a portion the same as the recess portion 4b, the recess portion 4f is a flat portion for guiding a claw portion of the card adapter. Bottom portions of the respective recess portions 4d through 4f are terminated at the laminated portion 1ac.

Figure 8:
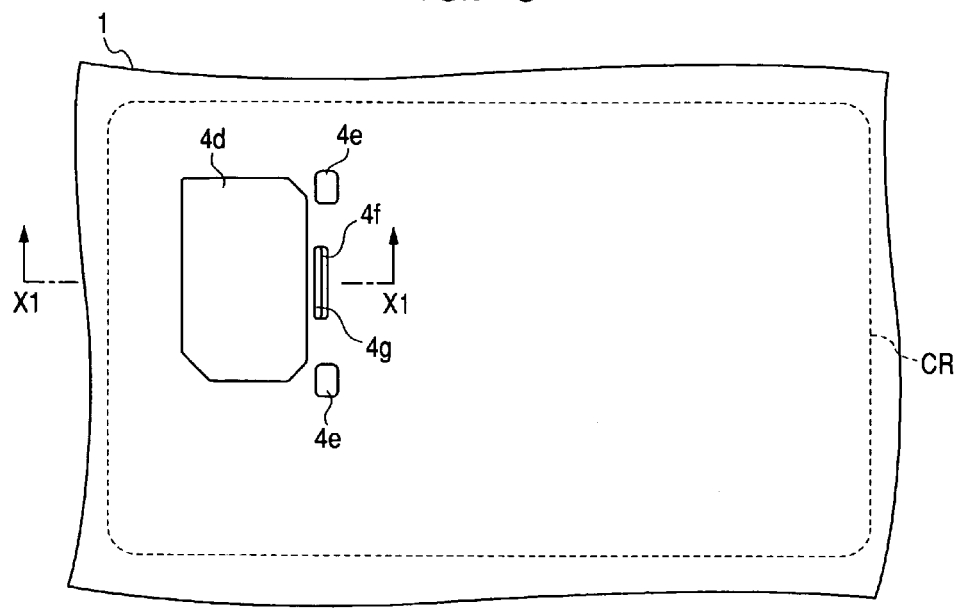
FIG. 8 is a plane view enlarging an essential portion of a card board in a step of fabricating an IC card continued from FIG. 6.
Figure 9:
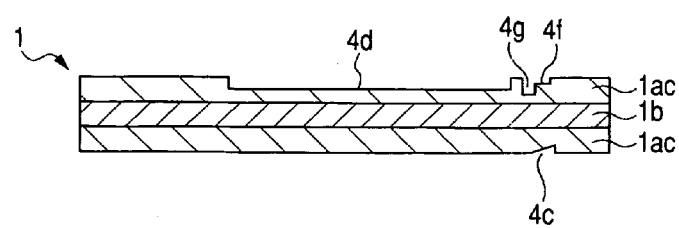
FIG. 9 is an enlarged sectional view taken along a line X1-X1 of FIG. 8.
Figure 10:
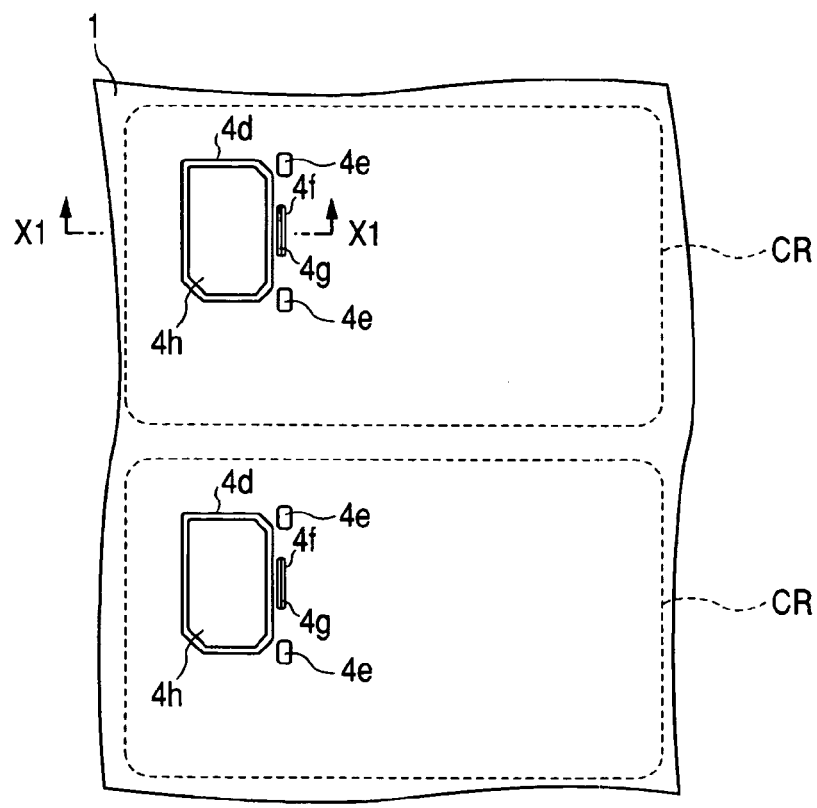
FIG. 10 is a plane view of an essential portion of a card board in a step of fabricating an IC card continued from FIG. 8.

Successively, as shown by FIG. 8 and FIG. 9, deep recess portions 4g are formed by, for example, milling similar to the above-described for the respective card regions CR of the second main face of the card board 1. FIG. 9 shows a plane view of an essential portion of the second main face of the card board 1, FIG. 10 shows an enlarged sectional view taken along a line X1-X1 of FIG. 9, respectively. The recess portion 4g is a portion into which the claw portion of the card adapter is brought.

Figure 11:
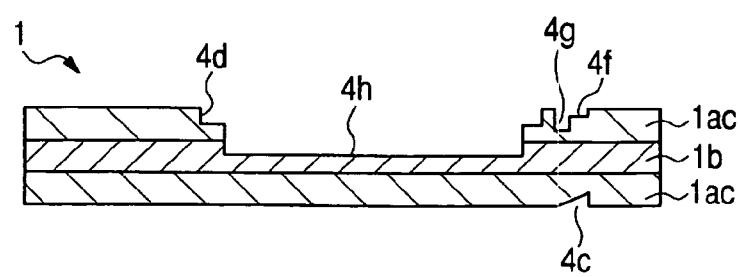
FIG. 11 is an enlarged sectional view taken along a line X1-X1 of FIG. 10.

Successively, as shown by FIG. 10 and FIG. 11, deep recess portions 4h are formed by, for example, milling similar to the above-described for the respective card regions CR of the second main face of the cardboard 1 (step 101a2). FIG. 10 shows a plane view of an essential portion of the second main face of the card board 1, FIG. 11 shows an enlarged sectional view taken along a line X1-X1 of FIG. 10, respectively. The recess portion 4h is a portion containing a resin sealing portion of the IC portion. By forming the card base member 1b by a material having a modulus of elasticity higher than those of the printing sheet 1a and the cover sheet 1c, and constituting a bottom portion of the recess portion 4h by a shape terminated at a position of reaching the card base member 1b, a controllability of the shape of the recess portion 4h can be promoted and a dimensional accuracy of a depth of the recess portion 4h can be promoted. Since the recess portion 4h is a portion containing the IC resin sealing portion of the IC portion, when the portion is not formed by a depth as designed, there is a case in which the IC portion cannot adequately fitted thereto and yield of the IC card is deteriorated. On the other hand, when the recess portion 4h is formed to be excessively deep in consideration only of attachment of the IC portion, in addition to the fact that the thickness of the card board 1 is inherently thin, the recess portion 4h is the deepest, and an area thereof is large and therefore, there is a case of deteriorating a mechanical strength of the IC card (particularly, a cap portion, mentioned later). In contrast thereto, according to Embodiment 1, the dimensional accuracy of the depth of the recess portion 4h can be promoted and therefore, there is not brought about a drawback in attachment of the IC portion and the mechanical strength of the IC card (particularly, a cap portion) is not deteriorated. Therefore, yield, reliability and service life of the IC card can be promoted.

Incidentally, although in the above-described explanation, the explanation has been given of a case of forming the recess portions 4d through 4h at the second main face of the card board 1 after forming the recess portions 4a through 4c at the first main face of the cardboard 1, contrary thereto, the recess potions 4a through 4c may be formed at the second main face of the card board 1 after forming the recess portions 4d through 4h at the second main face of the card board 1. When the relatively shallow recess portions 4a through 4c are formed after precedingly forming the relatively deep recess portions 4g, 4h, there is concern of bringing about crack or the like at the card board 1 at portions of the deep recess portions 4g, 4h in machining the shallow recess portions 4a through 4c. In contrast thereto, by forming the recess portions 4d through 4h deeper than the recess portions 4a through 4c at the second main face of the card board 1 after forming the recess portions 4a through 4c at the first main face of the card board 1 as described above, the recess portions 4d through 4h can be formed further safely without bringing about crack or the like at the card board 1.

Further, although in above-described explanation, the explanation has been given of a case of progressing the machining processing such that after forming the recess portions 4d through 4f at, for example, all of the card regions CR, the recess portions 4g, 4h having depths considerably different from those of the recess portions 4d through 4f at all of the card regions CR, the invention is not limited thereto but, for example, the machining processing may be progressed such that, for example, at one of the card regions CR of the second main face of the card board 1, all of the recess portions 4d through 4h necessary therefore are formed, thereafter, at other card region CR of the second main face of the card board 1, all of the recess portions 4d through 4h necessary therefor are formed.

Figure 12:
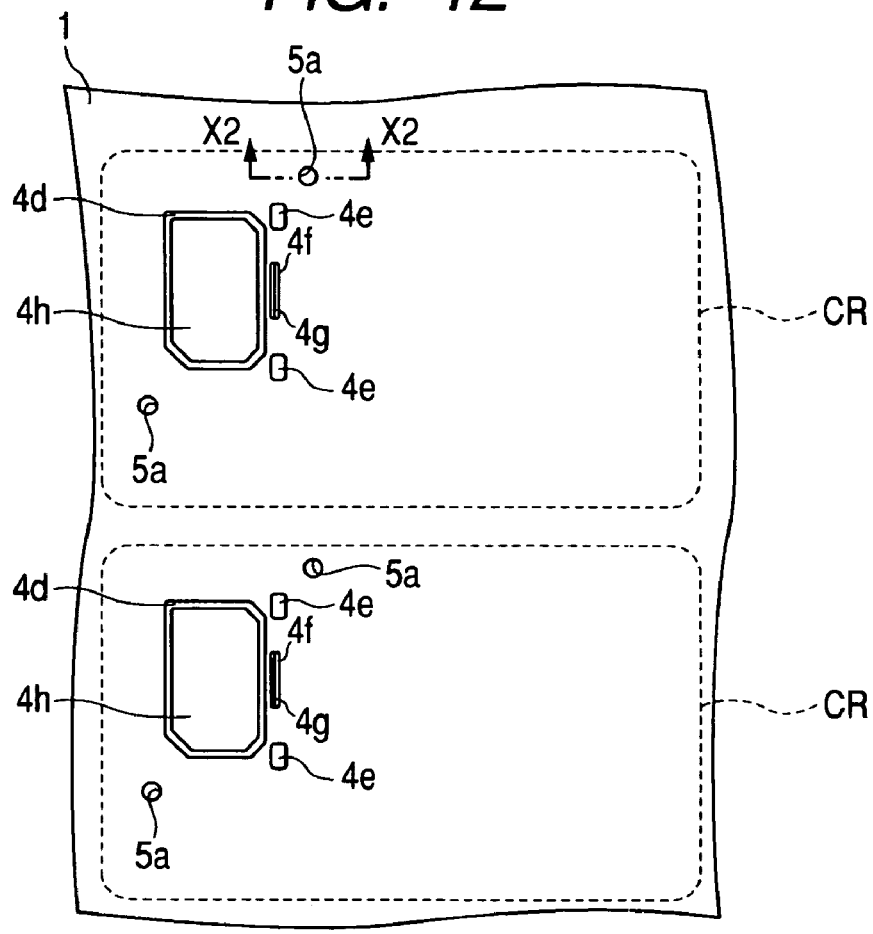
FIG. 12 is a plane view of an essential portion of a card board in a step of fabricating an IC card continued from FIG. 10.
Figure 13:
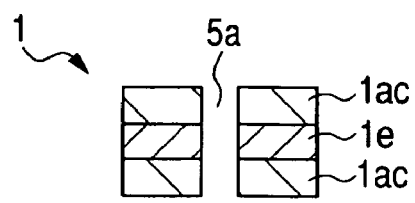
FIG. 13 is an enlarged sectional view taken along a line X2-X2 of FIG. 12.

Successively, as shown by FIG. 12 and FIG. 13, positioning holes 5a penetrating the first main face and the second main face of the card board 1 are formed at the respective card regions CR of the card board 1 (step 101b). FIG. 12 shows a plane view of an essential portion of the second main face of the card board 1, FIG. 13 shows an enlarged sectional view taken along a line X2-X2 of FIG. 20, respectively. The positioning hole 5a is a portion used for positioning individual card members and an IC card fabricating apparatus, here, there is exemplified a case of forming two pieces of positioning holes 5a to be disposed in directions skewed to each other. By forming the positioning hole 5a and the recess portions 4a through 4h at the same cutting step 101, not only operational efficiency can be promoted but also relative positional accuracies of the positioning hole 5a and the recess portions 4a through 4h can be promoted.

Figure 14:
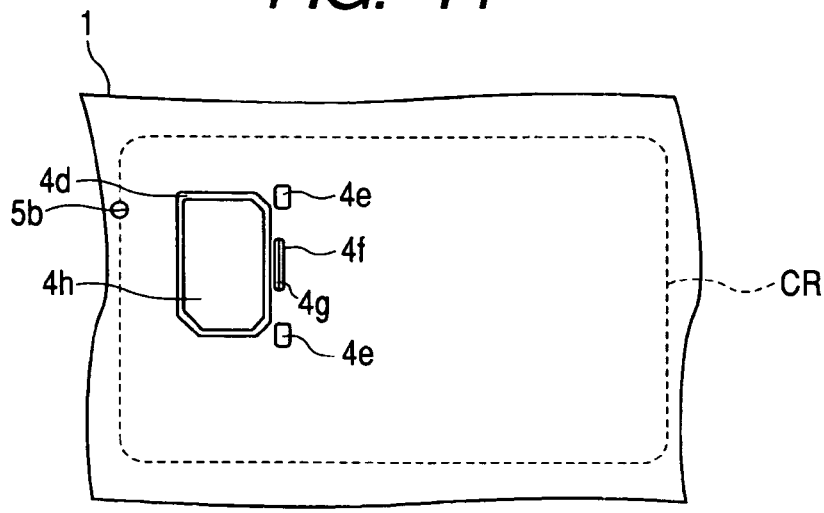
FIG. 14 is a plane view of an essential portion of a card board showing a modified example of a positioning portion.

However, the recess portions 4a through 4h may be formed after forming the positioning hole 5a. In this case, when the recess portions 4a through 4h are formed, positions of the respective card regions CR and the machining apparatus may be matched by the positioning hole 5a and therefore, from a view point of the relative positional accuracies of the positioning holes 5a and the recess portions 4a through 4h, the positioning holes 5a and the recess portions 4a through 4h may not be formed at the same cutting step. Further, although here, there is exemplified a case of forming the positioning holes 5a at two portions for the respective card regions CR, a number of pieces thereof is not limited to two pieces thereof but can variously be changed. However, when an excessive number thereof is formed, there is a case of deteriorating a region of a character, a pattern or the like printed on the surface of the IC card, further, also a mechanical strength of the IC card is deteriorated and therefore, about two pieces thereof is preferable. As a modified example of the positioning portion, as shown by FIG. 14, a positioning hole 5b may be formed to ride over an outer peripheral line of the card region CR. In this case, only a portion of an outer periphery of the card region CR is deficient and therefore, a region of a character, a pattern or the like of the common information or identification information is not considerably deteriorated thereby. Further, in the case of the positioning hole 5b, when separated to individual card members as mentioned later, the positioning hole 5b remains as a notch at a portion of a side face of the outer periphery of the card member, in that case, a positioning pin or the like is not inserted thereinto in positioning and therefore, the positioning can be facilitated. Although there is disclosed a case in which the positioning hole 5b is a circular hole as a shape thereof according to the embodiment, the invention is not limited thereto but there may be adopted a hole shape of shapes of ellipse, triangle, quadrangle or the like and a shape of a positioning pin.

Figure 15:
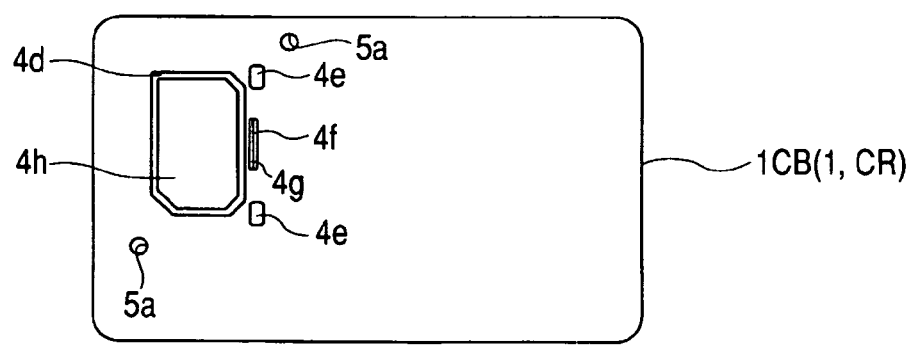
FIG. 15 is a plane view of a total of a second main face of a card member cut out from the card board of FIG. 12.
Figure 16:
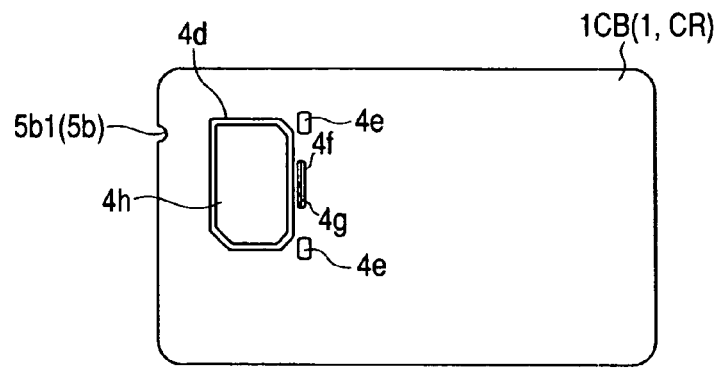
FIG. 16 is a plane view of a total of a second main face of a card member cut out from the card board of FIG. 14.

Successively, as shown by FIG. 15, the individual card regions CR are cut out from the card board 1 by punching (step 102). FIG. 15 shows a plane view of a total of a second main face of a card member 1CB cut out from the card board 1. Further, FIG. 16 shows a plane view of a total of the second main face of the card member 1CB cut out from the card board 1 in the case of FIG. 14. In this case, the positioning hole 5b remains as a notch 5b1 at a side face of a short side of the card member 1CB.

Successively, identification information (second information) is printed on the card member 1CB (step 103). The identification information is information which differs for respectives of a plurality of IC cards such as personal information used for acknowledgement or the like of an individual. The individual information is printed by a method of using, for example, a thermally transcribing method, a laser drawing method, an embossing, a hologram film, a method of writing the identification information to a magnetic tape pasted to the card member 1CB as magnetic information, or a method compounded with two kinds or more thereof. As the identification information, in addition to information having high individual acknowledgement performance which can be understood through visual sense of, for example, a face photograph or the like, there is information having high individual acknowledgement performance which can be recorded by using an exclusive reading apparatus although the information cannot be understood through the visual sense as in a bar code, magnetic information or the like. Also in the step 103 for printing the identification information, by positioning with the card member 1CB by the positioning hole 5a, the identification information can be printed by positioning the identification information excellently. The step of printing the identification information maybe carried out by steps indicated by broken lines of FIG. 1. That is, the step may be carried out by a step after a step 104 of pasting the IC portion, mentioned later, and before a step 105 of writing data, after the step 105 of writing data and before a punching step 106, or by two or more of the steps.

Figure 17:
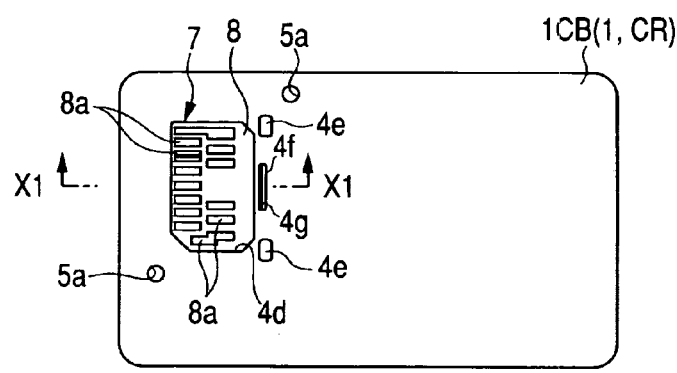
FIG. 17 is a plane view of a total of a second main face of a card member after pasting an IC portion.
Figure 18:
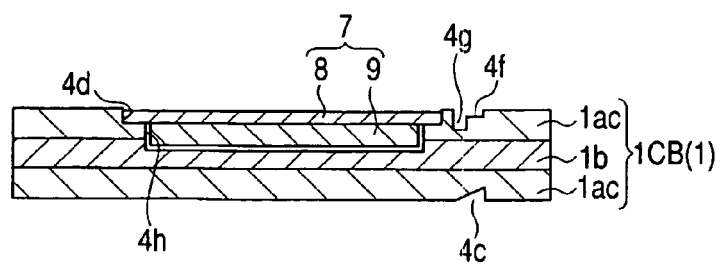
FIG. 18 is an enlarged sectional view taken along a line X1-X1 of FIG. 17.

Successively, as shown by FIG. 17 and FIG. 18, the IC portion 7 is fixed to the recess portions 4d, 4h of the second main face of the card member 1CB in a state of being fitted thereto (step 104). FIG. 17 shows a plane view of a total of the second main face of the card member 1CB after the step of pasting the IC portion 7, FIG. 18 shows an enlarged sectional view taken along a line X1-X1 of FIG. 17, respectively. The IC portion 7 is a portion formed with IC and includes a wiring board 8 and a resin sealing portion 9. The IC portion 7 is pasted thereto in a state of containing the resin sealing portion 9 in the recess portion 4h of the second main face of the card member 1CB and is pasted thereto in a state in which a back face (surfaced face) of the wiring board 8 is surfaced to outside. The back face (surfaced face) of the wiring board 8 is arranged with, for example, 14 pieces of external terminals 8a. A detailed explanation will later be given of the IC portion 7. Also in the step 104 of pasting the IC portion 7, the IC portion 7 can be fitted thereto with excellent positioning by being positioned with the card member 1CB by the positioning hole 5a.

Figure 19:
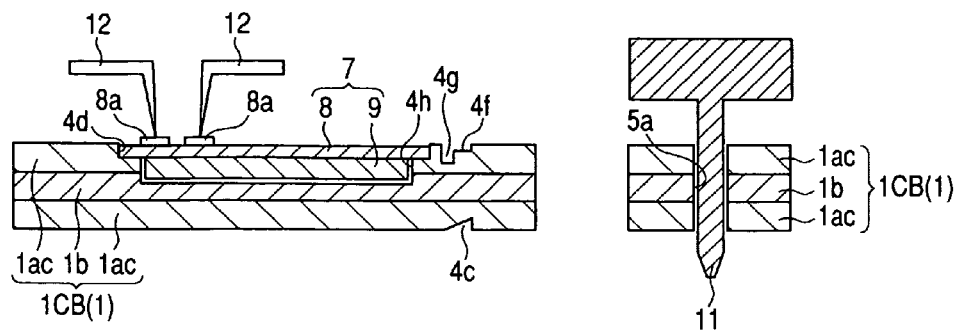
FIG. 19 is a sectional view of a card member in a data writing step.

Successively, as shown by FIG. 19, a desired data is electrically written to a semiconductor chip, mentioned later, of the IC portion 7 (step 105). That is, in a state of positioning a data writing apparatus and the card member 1CB by inserting a positioning pin 11 of the data writing apparatus to the positioning hole 5a of the card member 1CB, and in a state of butting a data pin 12 of the data writing apparatus to the external terminal 8a of the IC portion 7, the data is written thereto electrically. The IC portion 7 is provided with a plurality of pieces of data terminals for inputting and outputting data in order to deal with high speed data transmission. Further, there is also a case of respectively providing pins for dealing with a plurality of interface modes in order to deal with a variety of formation of interface. According to the embodiment, there are provided a terminal for constituting contact type interface and antenna terminals 8a7, 8a8 for constituting noncontact type interface. In this way, according to the IC portion 7 according to the embodiment, in comparison with an IC card of the background art, a number of pins is increased by respective situations and therefore, a width of the external terminal 8a of the IC portion 7 and an interval of contiguous ones thereof are narrower than those of a general IC card and there is a possibility that the width and the interval becomes more and more narrow in the future. Therefore, unless some countermeasure is devised with regard to positioning of the data writing apparatus and the card member 1CB, there is a case in which the data pin 12 cannot adequately be butted to the external terminal 8a and a failure in writing data is brought about. In contrast thereto, according to Embodiment 1, by inserting the positioning pin 11 of the data writing apparatus into the positioning hole 5a of the card member 1CB, positioning of the both members can be carried out with high accuracy and therefore, even when the width of the external terminal 8a and the interval between the contiguous ones become narrow, the data pin 12 and the external terminal 8a can be brought into contact with each other with excellent positioning. Therefore, a failure in writing data can be reduced or prevented from being brought about and therefore, the yield of the IC card can be promoted. Further, labor of rewriting data is reduced and therefore, a speed of fabricating the IC card can be accelerated. Further, after writing to process data as described above, a simple test may be carried out for the IC portion 7 by executing positioning similar to writing the data.

Figure 20:
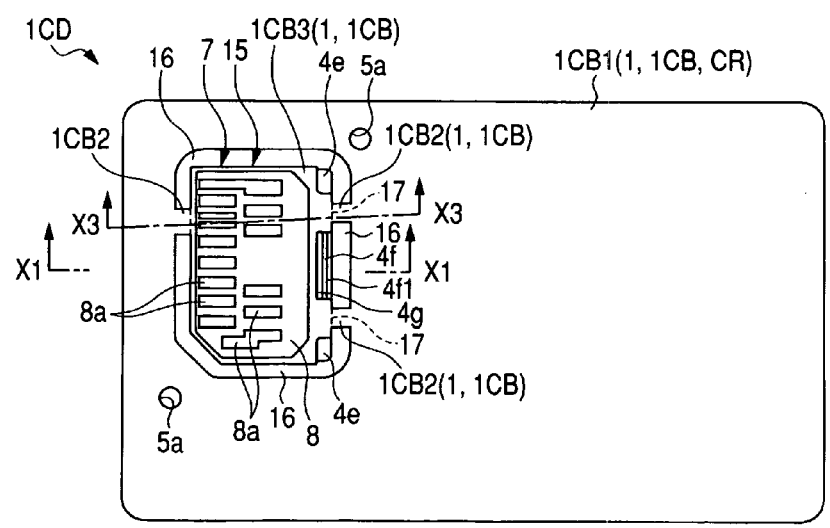
FIG. 20 is a plane view of a total of a second main face of an IC card according to an embodiment of the invention.
Figure 21:
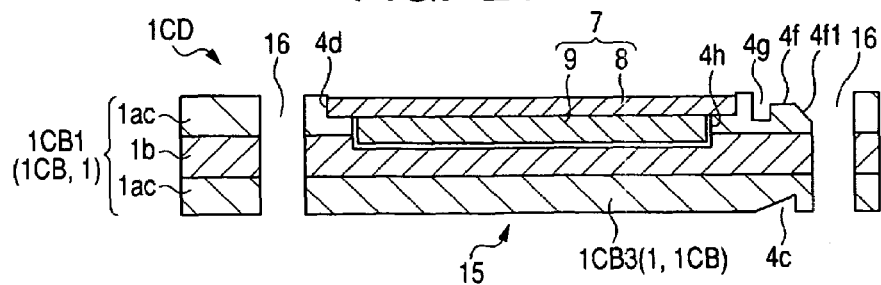
FIG. 21 is a sectional view taken along a line X1-X1 of FIG. 20.
Figure 22:
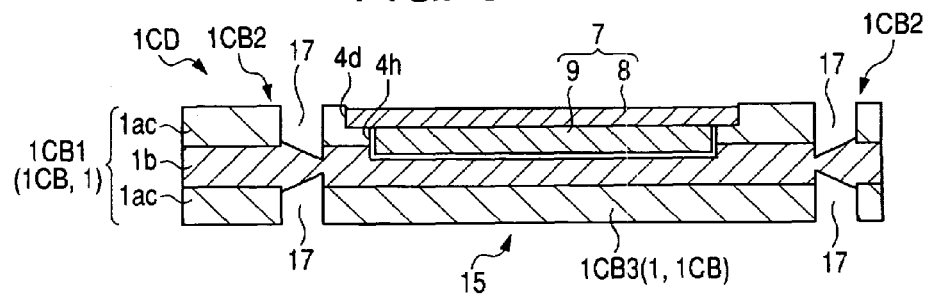
FIG. 22 is a sectional view taken along a line X3-X3 of FIG. 20.
Figure 23:
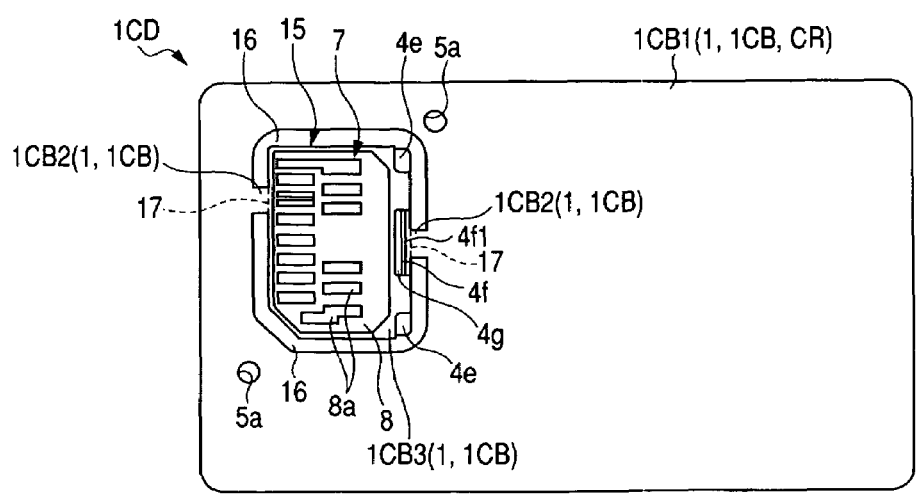
FIG. 23 is a plane view of a total of a second main face of an IC card according to other embodiment of the invention.
Figure 24:
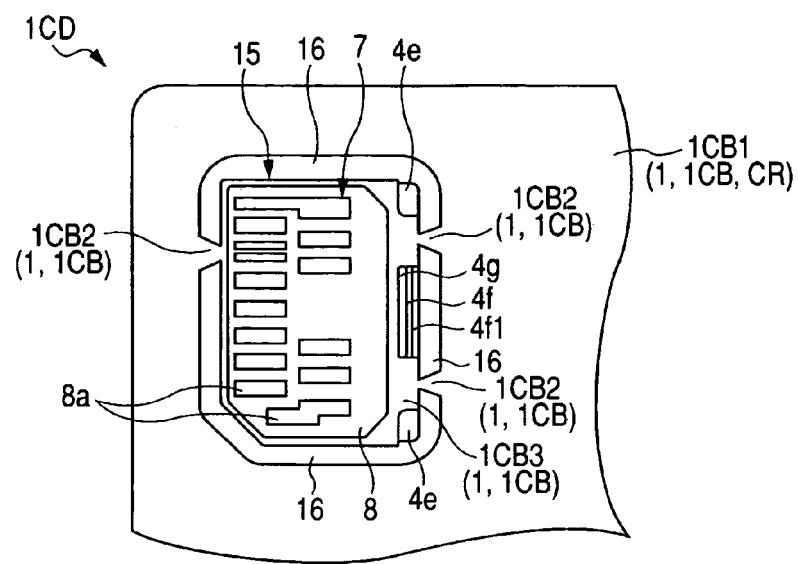
FIG. 24 is a plane view enlarging an essential portion of a second main face of an IC card according to other embodiment of the invention.

Successively, as shown by FIG. 20 through FIG. 22, a portion of the card board 1 at an outer periphery of the IC card main body 15 of the card member 1CB is punched by punching or the like (step 106). Further, a taper 4f1 is formed at a corner portion on a side of an outer periphery of the recess portion 4f. Thereby, the IC card 1CD is formed. FIG. 20 shows a plane of a total of the second main face of the IC card 1CD, FIG. 21 and FIG. 22 respectively show enlarged sectional views taken along a line X1-X1 and a line X3-X3 of FIG. 20. The IC card 1CD includes a frame member portion 1CB1, and the IC card main body 15 held in a state of being hung in the frame by way of a connecting portion 1CB2. The IC card main body 15 includes a cap portion 1CB3 and the IC portion 7. An opening portion 16 penetrating the first main face and the second main face of the card member 1CB are formed at a portion of the IC card main body 15 other than a connecting portion 1CB2 of an outer periphery thereof. The first main face and the second main face of the connecting portion 1CB2 are formed with grooves 17 such that the IC card main body 15 can be cut out manually. The connecting portions 1CB2 are connected to a front face and a rear face (two left and right ends of FIG. 20, both ends in a direction of a short side of the IC card main body 15) of the IC card main body 15 as mentioned later, and are not connected to side faces (two upper and lower ends of FIG. 20, both ends in a longitudinal direction of the IC card main body 15) of the IC card main body 15. Although the IC card includes the front face constituting an end face on a side of being aligned with external terminals 8a and on a side constituting a head portion in inserting into a card slot, a rear face on an opposed side of the front face and a side face in parallel with an inserting direction in being inserted into the card slot other than the first main face constituting the card surface and the second main face exposing the external terminals, the side face of the IC card main body 15 is a portion of being brought into a guide at inside of the card slot when the IC card main body 15 is cut out from the IC card 1CD and mounted to the desired card slot of the electronic apparatus and therefore, a consideration is given to the fact that when a cut residue or the like of the connecting portion 1CB2 is present at the portion, the IC card main body 15 cannot adequately be put into and put out from the electronic apparatus. That is, according to Embodiment 1, the IC card main body 15 can smoothly be put into or put out from the desired electronic apparatus. Further, the connecting portion 1CB2 is formed to avoid the recess portions 4e, 4f and the taper portion 4f1. This is because a consideration is given to the fact that it is difficult to form the groove 17 of the connecting portion 1CB2 at the portion of the recess portion 4e or the like. That is, according to Embodiment 1, a performance of facilitating to form the IC card 1CD can be promoted. Further, a portion of the recess portion 4e or the like is a portion of being attached with a card adapter and therefore, similar to the above-described, a consideration is given to the fact that when there is a cut residue or the like of the connecting portion 1CB2 at the portion, the card adapter cannot adequately be attached thereto. That is, according to Embodiment 1, a card adapter can excellently be attached to the IC card main body 15. Further, although in the example of FIG. 20, an explanation is given of a case of providing 3 portions of the connecting portions 1CB2, the invention is not limited thereto but can variously be changed. For example, as shown by FIG. 23, the connecting portion 1CB2 may be connected to respectives of the front face and the rear face of the IC card main body 15 by single portions thereof. The connecting portion 1CB2 of the rear face of the IC card main body 15 is formed at a portion of the IC card main body 15 for forming the taper portion 4f1 substantially at a center in a longitudinal direction thereof. Further, as shown by FIG. 24, the connecting portion 1CB2 may gradually be converged to the IC card main body 15. Further, the connecting portion 1CB2 may be converged to the IC card main body 15 in steps. When a length of connecting the connecting portion 1CB2 and the IC card main body 15 is made to be shorter than a length of connecting the connecting portion 1CB2 and the frame member portion 1CB1 as described above, it is not necessary to form the groove 17. Thereby, the performance of facilitating to form the IC card 1CD can be promoted.

Figure 25:
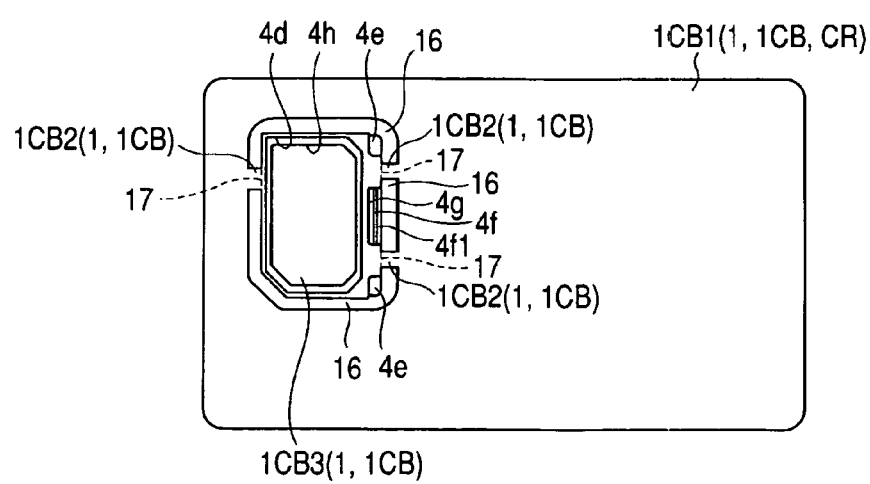
FIG. 25 is a plane view of a total of a second main face in a step of fabricating an IC card according to other embodiment of the invention.

Even in the punching step 106, the outer peripheral portion of the IC card main body 15 can be punched with excellent positioning by matching positions of the card member 1CB and a punching apparatus by the positioning hole 5a. The punching step may be carried out by steps indicated by broken lines of FIG. 1. That is, the punching step may be carried out before the segmentation step 102, after the segmentation step 102 and before the step 103 of printing the identification information, after the step 103 of printing the identification information and before the step 104 of pasting the IC portion, after the step 104 of pasting the IC portion and before the step of 105 of writing data. For example, FIG. 25 shows a plane view of a total of the second main face of the card member 1CB after carrying out the punching step 106 after the segmentation step 102 and before the step 104 of pasting the IC portion. The IC portion 7 may be pasted thereafter.

Figure 26:
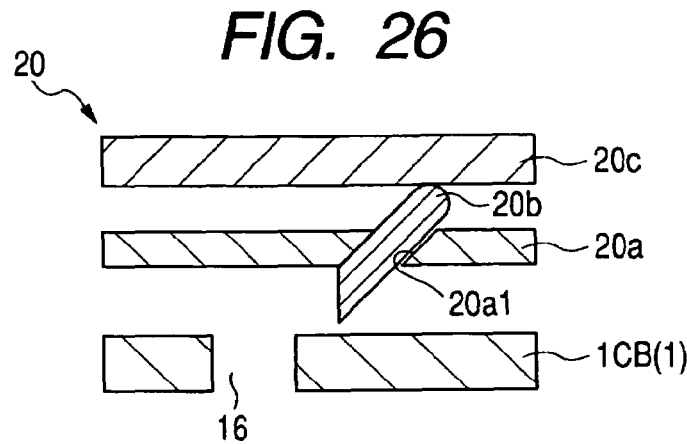
FIG. 26 is an explanatory view of a step of machining a taper portion.
Figure 27:
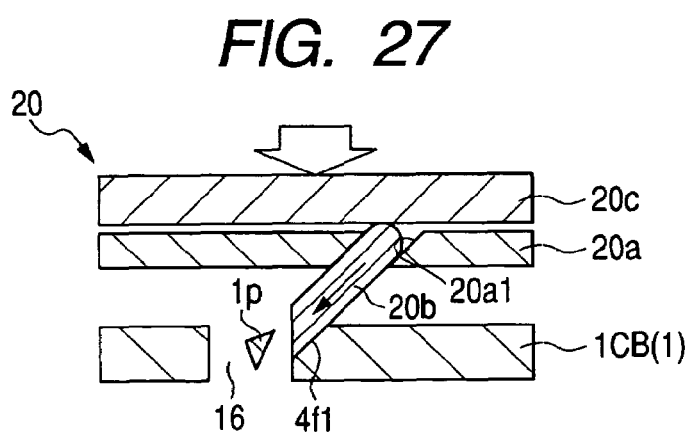
FIG. 27 is an explanatory view of a step of machining a taper portion continued from FIG. 26.
Figure 28:
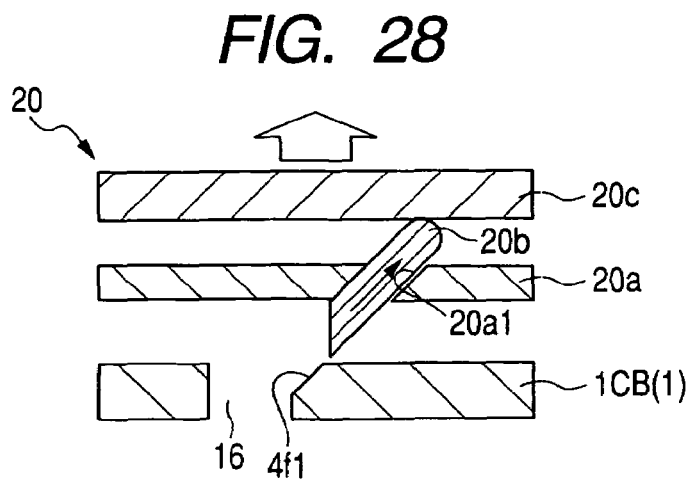
FIG. 28 is an explanatory view of a step of machining a taper portion continued from FIG. 27.

An explanation will be given of an example of a method of forming the taper 4/1 in reference to FIG. 26 through FIG. 28. FIG. 26 through FIG. 28 are explanatory views of a die 20 for working the taper. A fixed plate 20a of the die 20 is formed with a guide hole 20a1 penetrating main and back faces thereof in a state of being skewed to the main and back faces of the fixed plate 20a. The guide hole 20a1 is a hole for guiding a direction of sliding a movable blade 20b fitted into the hole in a movable state. A movable plate 20c is installed above the fixed plate 2a in a state of being able to be moved in an up and down direction. First, positions of the die 20 and the card member 1CB are matched by the positioning hole 5a. Thereby, the card member 1CB is set such that when the movable plate 20b is slid to a lower side along the guide hole 20a1, a portion of a blade of a front end of the movable blade 20b is butted to a taper working portion constituting an object of the card member 1CB. Successively, as shown by FIG. 27, the movable plate 20c is moved down and the movable blade 20b is skewedly slid along the guide hole 20a1 of the fixed plate 20a. Then the portion of the blade of the cut blade 20b cuts off the corner portion constituting an object of the card member 1CB. A cut chip 1p produced at that occasion is thrown away by way of the opening portion 16. Thereafter, as shown by FIG. 28, the movable plate 20c is moved up to return to an original position and the movable blade 20b is moved in a skewed upper direction. Thereby, the cut blade 20b is separated from the card main body 1CB, and the taper portion 4/1 can be formed at the portion constituting the object of the card member 1CB.

In this way, according to Embodiment 1, a constitution particular to RS-MMC (Reduced Size Multi Media Card), for example, an outer shape, a pin arrangement or an interface constitution or the like can be made in the IC card 1CD (IC card main body 15). Therefore, the IC card 1CD (IC card main body 15) having high functional performance can be provided.

Further, the IC card 1CD (IC card main body 15) can efficiently be fabricated by summarizingly printing the common information to a plurality of card regions CR and printing or forming the identification information for the respective individual card members 1CB. Further, an erroneous display can be reduced or prevented from being brought about.

Further, by carrying out the step 103 of printing the identification information, the step 104 of pasting the IC portion 7, the step 105 of writing data and the punching step 106 after the segmentation step 102, operation of the respective steps can be carried out by using the IC card fabricating apparatus which has been used without remodeling the IC card fabricating apparatus, or newly forming the IC card fabricating apparatus. Therefore, even in fabricating the novel IC card 1CD, enormous capital investment is not carried out at an initial stage, further, it is not necessary to considerably look at the fabricating steps again.

Further, by delivering the IC card 1CD in a state of having the frame member portion 1CB1 at a surrounding of the IC card main body 15, even when a plurality of card standards are produced, the outer shape can be standardized by the frame member portion 1CB1. By standardizing the outer shape by the frame member portion 1CB1, for example, a transportation system to customers can be shared by the plurality of the card standards and production cost can be restrained from being increased. Further, whereas when molded by a resin mold die as in a cap or a case of a so-to-speak memory card of MMC (Multi Media Card), RS-MMC, SD (Secure Digital) memory card or mini SD or the like, only a simple character, mark or the like can be displayed on a surface thereof, it is difficult to promote acknowledgement performance, security performance or an outlook thereof, in the case of the IC card 1CD of Embodiment 1, a clear character, a pattern, a diagram or a photograph or the like can be displayed on the surface of the cap portion 1CB3 further finely and therefore, acknowledgement performance and security performance can be promoted, the card cannot be forged simply and further, the outlook can be promoted. Further, before subjecting the respective cards to the segmentation step, in the state of connecting printing sheets by an amount of a plurality of cards, by summarizing printing the cards, the printing cost in producing a large amount of the cards can be reduced. Next, an explanation will be given of an example of a constitution of the IC card 1CD fabricated as described above.

Figure 29:
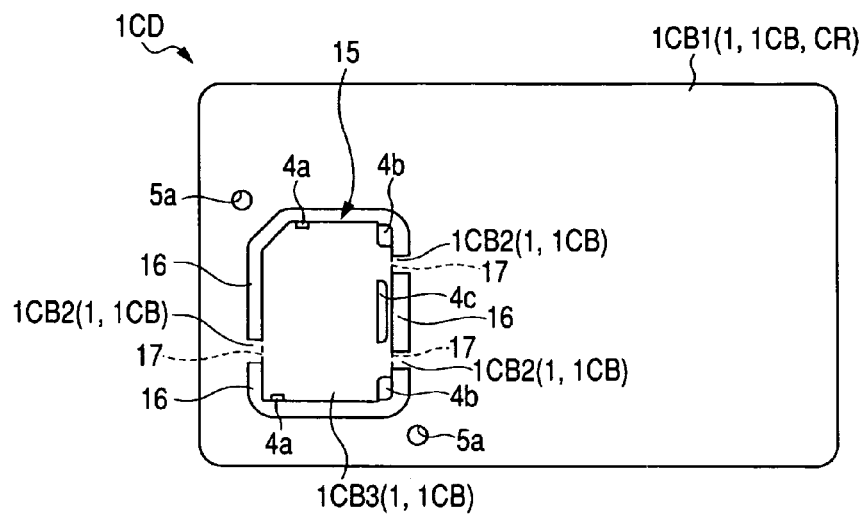
FIG. 29 is a plane view of a total of a first main face of an IC card according to an embodiment of the invention.
Figure 30:
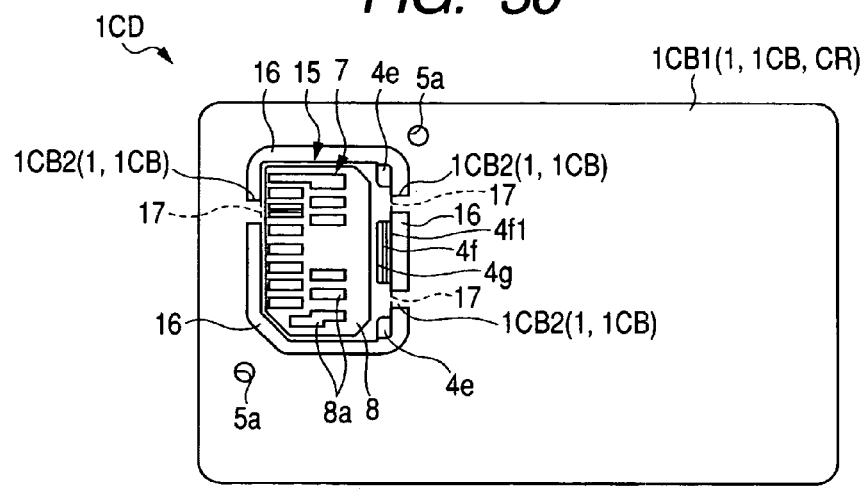
FIG. 30 is a plane view of a total of a second main face of the IC card of FIG. 29.
Figure 31:
FIG. 31 is a side view of the IC card of FIG. 29 and FIG. 30.

FIG. 29 shows a plane view of a total of the first main face of the IC card 1CD of Embodiment 1, FIG. 30 shows a plane view of a total of the second main face of the opposed face of the IC card 1CD of FIG. 29, FIG. 31 shows a side view of the IC card 1CD of FIG. 29 and FIG. 30.

An outer shape dimension of the IC card 1CD is, for example, about 85.6 mm×54 mm×1.4 mm. The IC card main body 15 of an essential portion of the IC card 1CD is a card type information medium having a high functional performance having both of a function as a so-to-speak IC card and a function as a so-to-speak memory card having a capacity larger than that of the IC card and a function higher than that of the IC card capable of executing a security processing. That is, the IC card main body 15 is constructed by a constitution which can be used in various fields requesting high security performance of finance, transportation, communication, delivery, acknowledgement and the like as in, for example, a credit card, a cash card, a card for ETC (Electronic Toll Collection system), a commutation pass, a card for a portable telephone, acknowledgement card or the like and can be used as a record media of a portable type information apparatus requesting transportability as in a digital camera, a notebook type personal computer, a portable type music player, a portable telephone or the like. With regard to a card type information medium having both of an IC card function and a memory card function, there is a detailed description in, for example, International Patent Publication No. WO 02/099742 A1.

Figure 32:
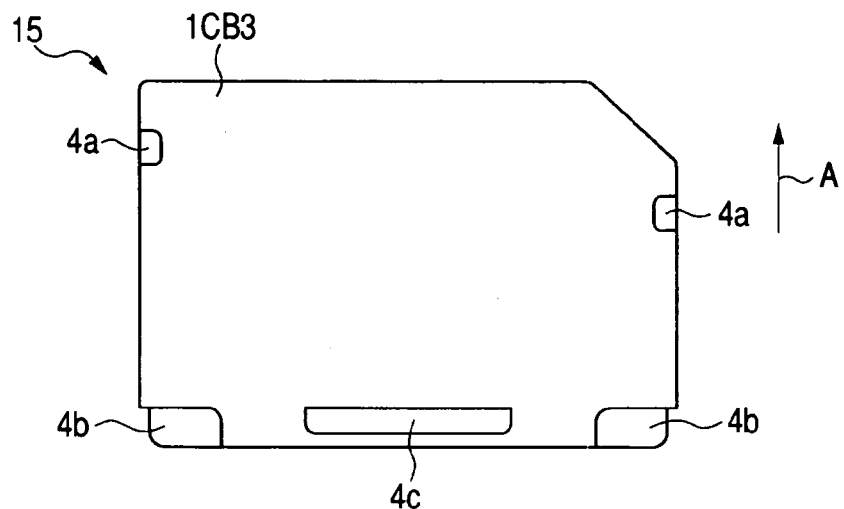
FIG. 32 is a plane view of a total of a first main face of an IC card main body.
Figure 33:
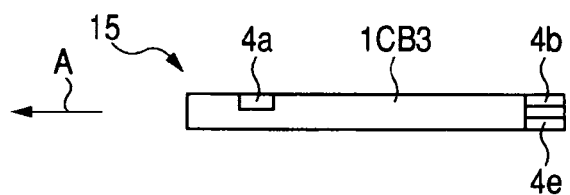
FIG. 33 is a side view viewing the IC card main body of FIG. 32 from a left side.
Figure 34:
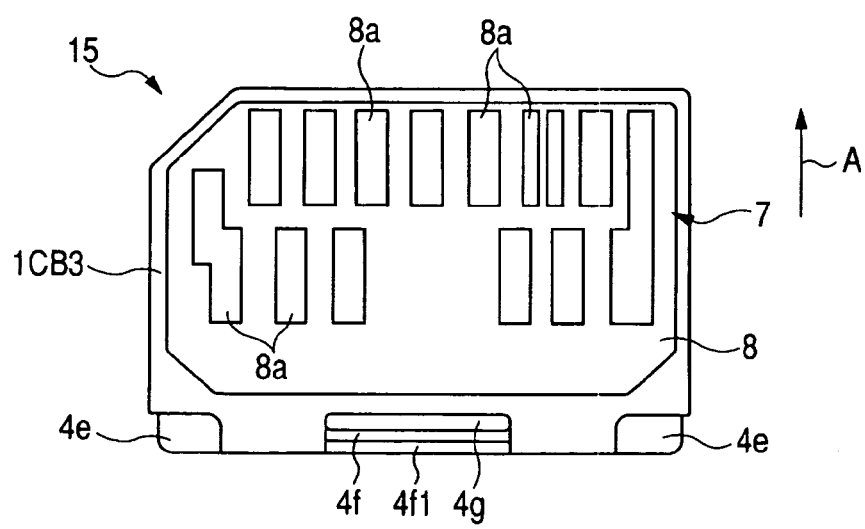
FIG. 34 is a plane view of a total of a second main face of the IC card main body of FIG. 32.

FIG. 32 through FIG. 33 show a behavior when the IC card main body 15 is cut out from the IC card 1CD. FIG. 32 shows a plane view of a total of the first main face of the IC card main body 15, FIG. 33 shows a side view when the IC card main body of FIG. 32 is viewed from a left side, FIG. 34 shows a plane view of a total of the second main face (face on a side opposed to the first main frame) of the IC card main body 15, respectively. An arrow mark A in FIG. 32 through FIG. 34 designates an example of a mounting direction when the IC card main body 15 is mounted to a desired electronic apparatus.

The IC card main body 15 can be cut out manually or by a simple cutting tool of a cutter knife or the like. The IC card main body 15 includes the cap portion 1CB3 and the IC portion 7. The cap portion 1CB3 is formed from the card board 1 similar to the frame member portion 1CB1 and the connecting portion 1CB2. The IC portion 7 is fitted to the recess portions 4d, 4h of the second main face of the cap portion 1CB3 and is firmly fixed thereto by an adhering member.

The outer shape of the IC card memory 15 is formed in compliance with, for example, a standard of an RS-MMC. That is, an outer shape dimension of the IC card main body 15 is, for example, about 18 mm×24 mm×1.4 mm. Further, one corner portion on a side of the front face of the IC card main body 15 (left side of FIG. 29 and FIG. 30) is significantly faced for indexing. Further, the recess portions 4a through 4c are formed at the first main face of the cap portion 1CB3 of the IC card main body 15, the recess portions 4e through 4g and the like are formed at the second main face of the cap portion 1CB3. The recess portion 4a is formed at a side face of the IC card main body 15, the recess portions 4b, 4e are formed at the corner portion on the side of the rear face of the IC card main body 15, the recess portions 4c, 4f, 4g and the taper portion 4f1 are formed at a center in a longitudinal direction of a side of the rear face of the IC card main body 15. Incidentally, different from general RS-MMC, the surfaces (first main face and the second main face) of the cap portion 1CB3 of the IC card main body 15 of Embodiment 1 are displayed with information of a character, a pattern, a diagram or a face photograph or the like which is finer and clearer, the IC card main body 15 is provided with higher acknowledgement performance, security performance and outlook. Further, corner portions of the respective recess portions 4a through 4h are formed with rounded tapers to construct a constitution of being difficult to bring about crack constituting onsets by the corner portions of the recess portions 4a through 4h.

Figure 35:
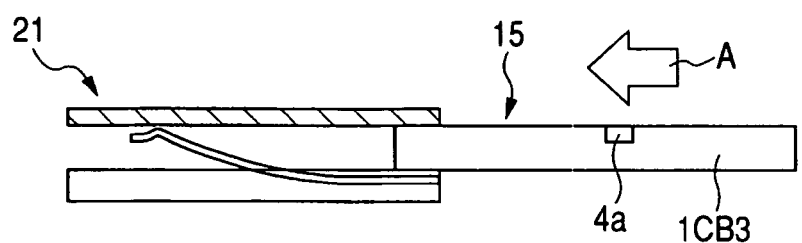
FIG. 35 is an explanatory view of an example of a behavior of an IC card main body before mounting the IC card main body to a connector.
Figure 36:
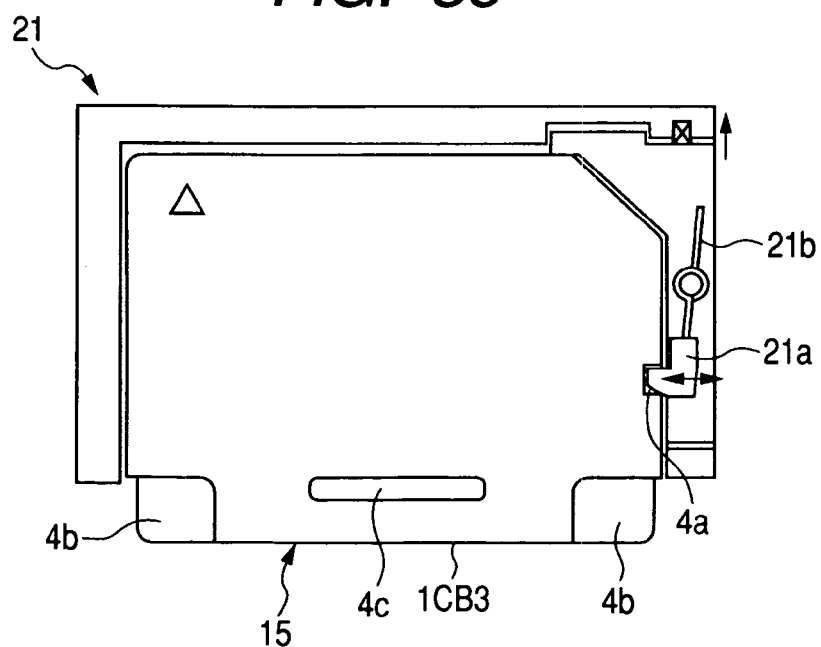
FIG. 36 is an explanatory view of an example of a behavior of an IC card main body after mounting the IC card main body to a connector 21.

The recess portion 4a of the first main face of the cap portion 1CB3 is a portion for restraining the IC card main body 15 from being drawn to be dropped from the electronic apparatus or jumping out to outside by impact or the like when the IC card main body 15 is mounted to a desired electronic apparatus. FIG. 35 shows a behavior of the IC card main body 15 when the IC card main body 15 is mounted to a connector 21, FIG. 36 shows an example of a behavior of the IC card main body 15 after the IC card main body 15 is mounted to the connector 21, respectively. When the IC card main body 15 is inserted to the connector 21 along the direction of the arrow mark A, a front end of a lock claw 21a of the connector 21 is brought into the recess portion 4a of the side face of the IC card main body 15. Other end of the lock claw 21a is attached with a coil spring 21b, and the lock claw 21a presses the IC card main body 15 by an urge force of the coil spring 21b. Thereby, the IC card main body 15 is not drawn to be dropped from the connector 21 or does not jump out to outside by some impact or the like. That is, the IC card main body 15 can firmly be held by the recess portion 4a of the IC card main body 15 and therefore, the IC card main body 15 can be restrained or prevented from being drawn to be dropped or jumping out.

Figure 37:
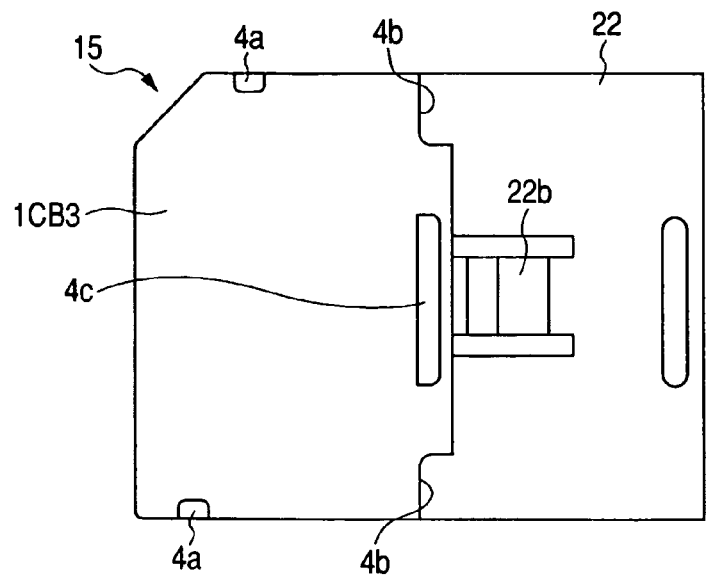
FIG. 37 is a plane view of a total of a first main body of an IC card main body mounted with a card adapter.
Figure 38:
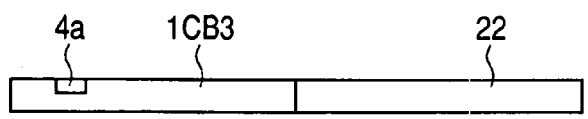
FIG. 38 is a side view viewing the IC card main body of FIG. 37 from a lower side.
Figure 39:
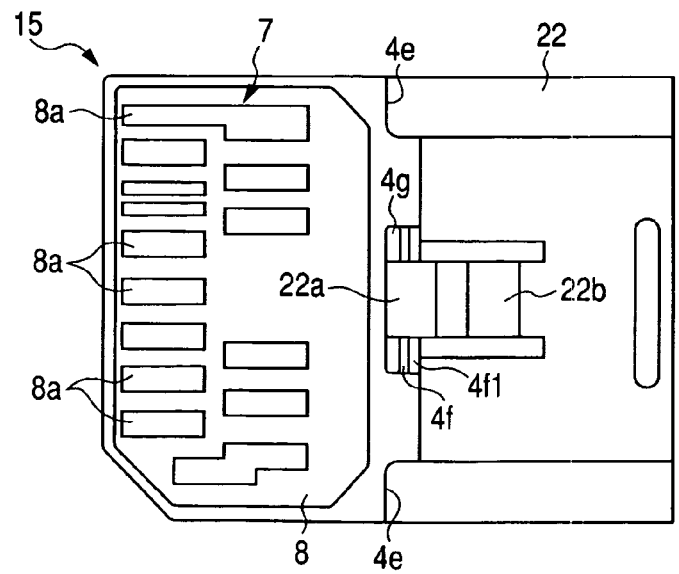
FIG. 39 is a plane view of a total of a second main face of the IC card main body of FIG. 37.

The recess portions 4b, 4e, 4f, 4g of the first main face and the second main face of the cap portion 1CB3 shown in FIG. 32 through FIG. 34 and the like are portions related to mounting the card adapter. FIG. 37 through FIG. 39 show a behavior of mounting a card adapter 22 to the IC card main body 15. The card adapter 22 is an auxiliary instrument for converting the IC card main body 15 of the RS-MMC standard to a standard of MMC of a full size (outer shape dimensions are 32 mm×24 mm×1.4 mm). By mounting the card adapter 22 to the IC card main body 15, the IC card main body 15 can be used even by an existing slot in correspondence with MMC of the full size. The card adapter 22 can firmly be attached to the side of the rear face of the IC card main body 15 by fitting a recess portion of the card adapter 22 to a projected portion formed by the recess portions 4b, 4e of the IC card main body 15 and bringing a claw portion 22a of the card adapter 22 into the recess portion 4g of the IC card main body 15. The claw portion 22a is provided at a front end of a leaf spring supporting portion 22b of the card adapter 22 to firmly press the IC card main body 15 by an urge force by the leaf spring supporting portion 22b.

Figure 40:
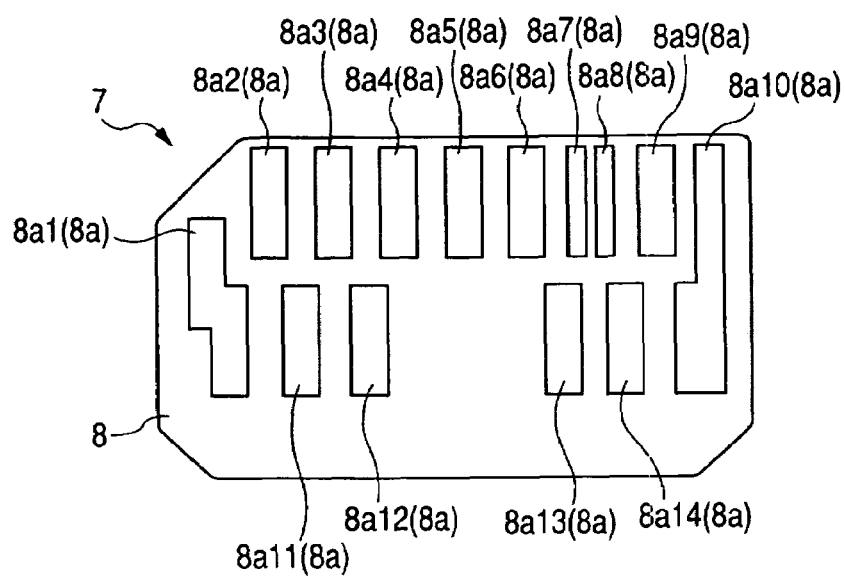
FIG. 40 is a plane view of a total of a contact face of a wiring board of an IC portion of an IC card main body.
Figure 85:
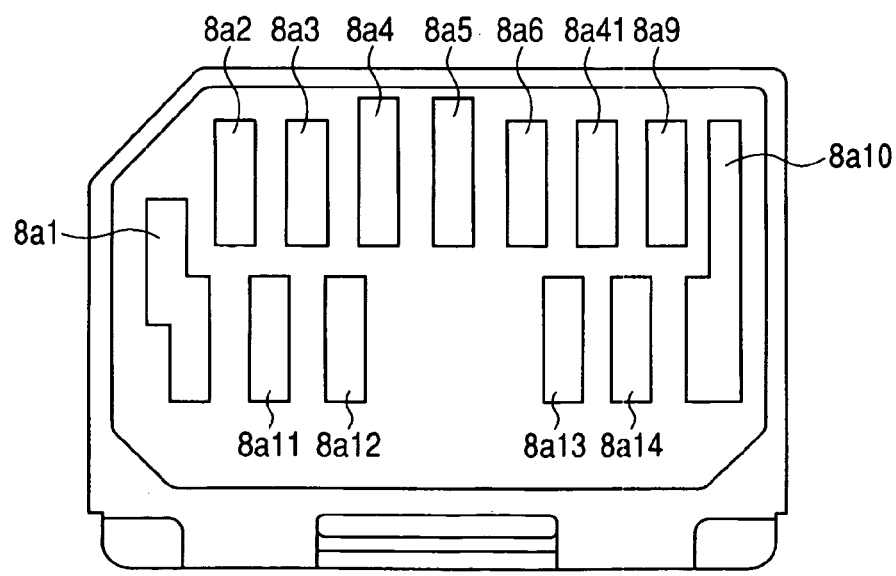
FIG. 85 is a plane view of a total of a second main face of an IC card main body according to other embodiment of the invention.
Figure 86:
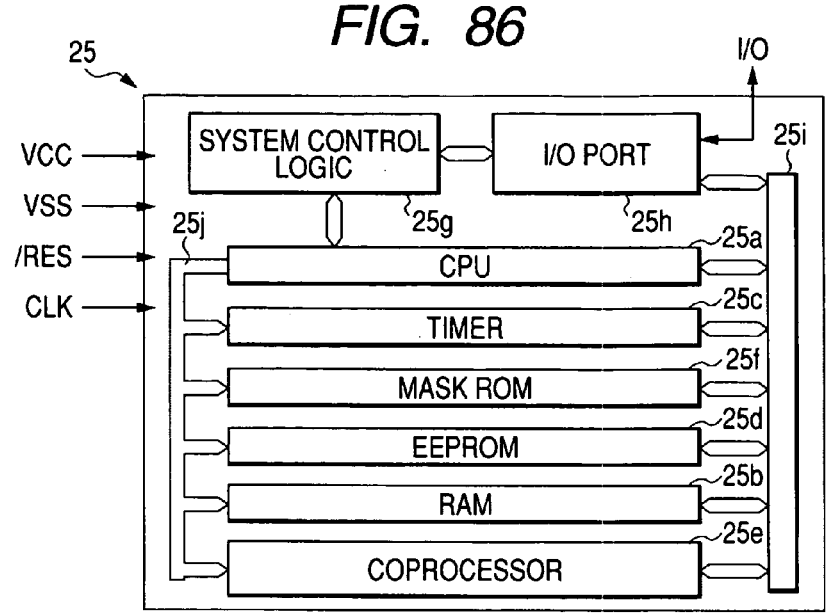
FIG. 86 is a circuit block diagram of an example of an IC card microcomputer circuit of an IC portion of the IC card main body of FIG. 85.
Figure 87:
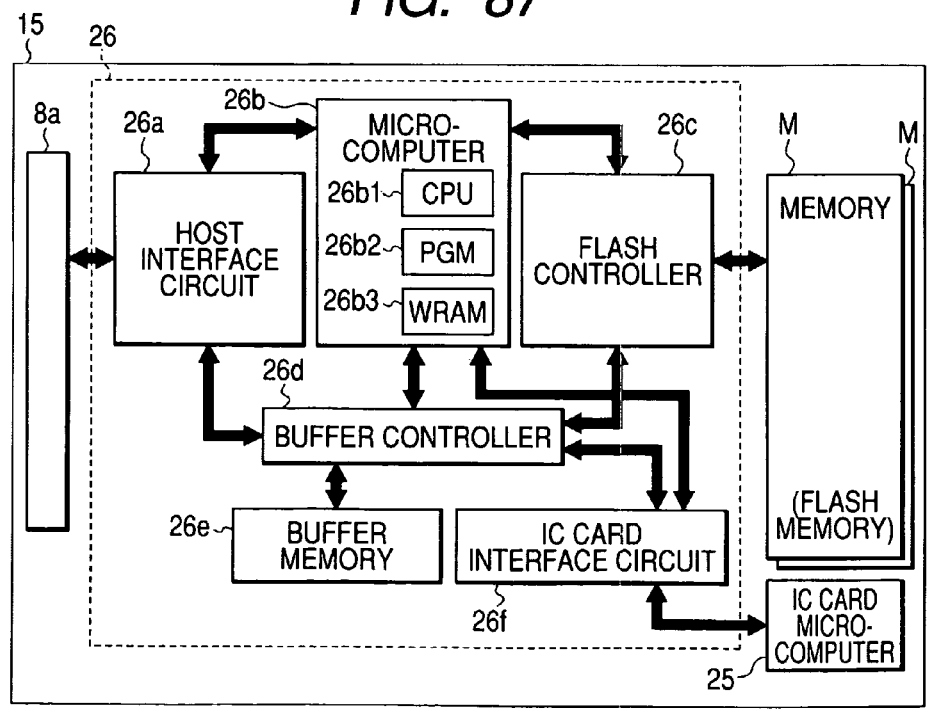
FIG. 87 is a circuit block diagram of an example of an interface controller circuit of an IC portion of the IC card main body of FIG. 85.

Next, an explanation will be given of the IC portion 7 of the IC card main body 15. FIG. 40 shows a plane view of a total of a contact face (surfaced face) of the IC portion 7. A board main body of the wiring board 8 of the IC portion 7 comprises, for example, a resin of glass epoxy species and the contact face is aligned to be arranged with, for example, 14 pieces of the external terminals 8a (8a1 through 8a14) in a state of being proximate to each other. The external terminal 8a is subjected to Ni plating and gold (Au) plating or the like at an exposed surface of a metal foil of copper (Cu) or the like, directly connected with a connection terminal of an outside apparatus (reader writer or the like) and includes a contact type interface portion for electrically connecting the outside apparatus and a circuit at inside of the IC card main body 15. Although not particularly limited, allocation of signals or the like of the respective external terminals 8a is, for example, as follows. That is, the external terminals 8a1, 8a9, 8a10, 8a11 through 8a14 are, for example, terminals for data, the external terminal 8a2 is, for example, a terminal for detecting the card or for data, the external terminal 8a3 is a terminal for, for example, command (CMD), the external terminal 8a4 is a terminal for a power source for supplying a power source voltage Vss1 of, for example, a low potential side, the external terminal 8a5 is a terminal for a power source for supplying a power source voltage Vcc of, for example, a high potential side, the external terminal 8a6 is a terminal for inputting, for example, a clock signal, the external terminals 8a7 and 8a8 are terminals for antennas for being respectively connected to electrodes TML1 and TML2 of an RF portion of a card microcomputer, and noncontact interface is realized by connecting, for example, an LC parallel resonating circuit to the external terminals 8a7 and 8a8. Further, a number of pieces of the external terminals 8a is not limited to 14 pieces but, for example, may variously be, for example, 7 pieces, 8 pieces, 9 pieces, 10 pieces, 11 pieces, 13 pieces, 16 pieces or 17 pieces and the like. FIG. 85 shows a plane view when the number of the external terminals 8a is 13 pieces, and FIG. 86 and FIG. 87 show functional block diagrams of an IC card in correspondence with FIG. 85. An IC portion stored in the IC card illustrated in FIG. 85 constitutes a point of difference in comparison with the IC portion 7 illustrated in FIG. 40 by that portions in correspondence-with the external terminals 8a7, 8a8 are formed with an external terminal 8a15 constituting a terminal for a power source for supplying the power source voltage Vss2 on the low potential side and the terminal for the antenna illustrated in FIG. 40 is not included. Further, as disclosed in FIG. 86 and FIG. 87, the IC card is a card which is not provided with a circuit for noncontact interface.

Figure 41:
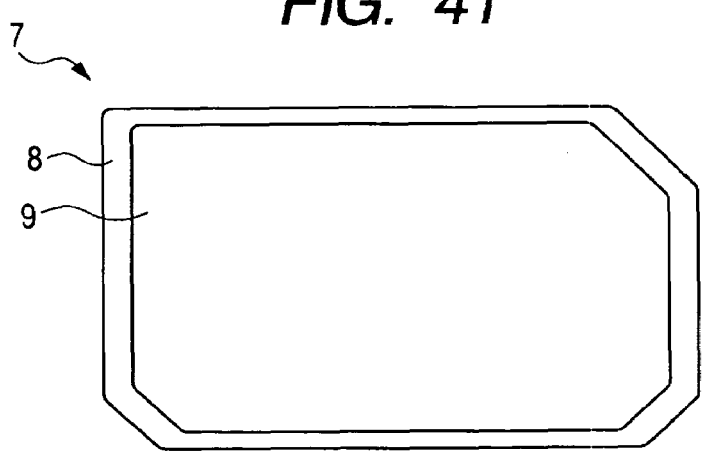
FIG. 41 is a plane view of a total of a mold face of a wiring board of an IC portion of an IC card main body.
Figure 42:
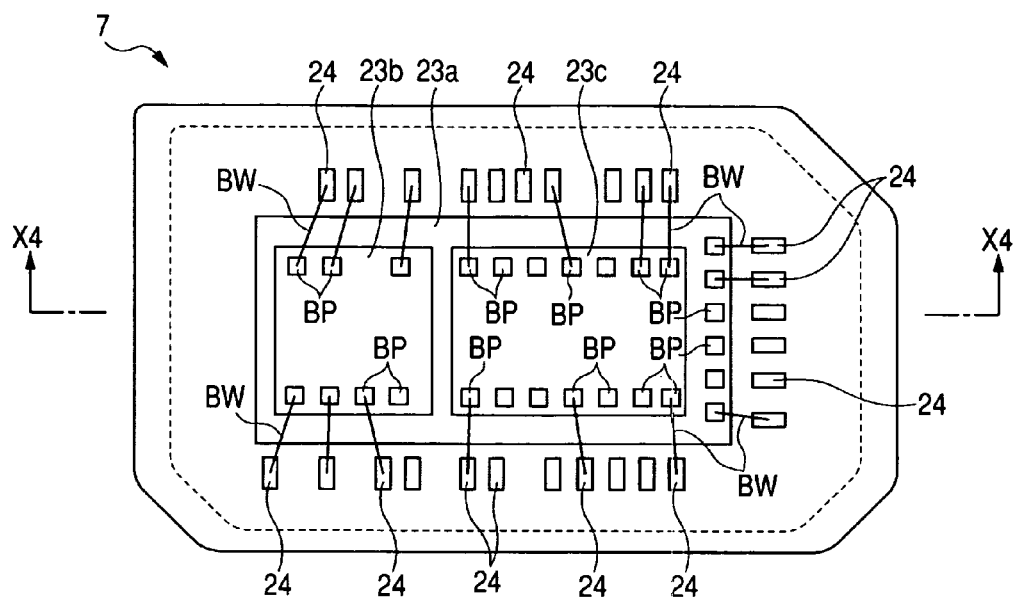
FIG. 42 is an enlarged plane view of a total of the mold face shown by removing a resin sealing portion of the IC portion of FIG. 41.
Figure 43:
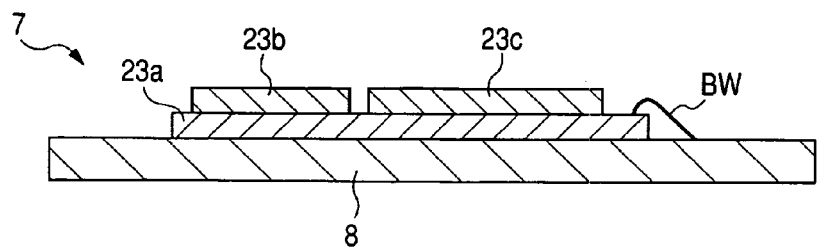
FIG. 43 is a sectional view taken along a line X4-X4 of FIG. 42.

FIG. 41 shows a plane view of a total of a mold face of the wiring board 8 (face formed with the resin sealing portion 9 on the back side of the contact face of the wiring board 8), FIG. 42 shows an enlarged plane view of a total of the mold face of the IC portion 7 shown by removing the resin sealing portion 9 of FIG. 41, FIG. 43 shows a sectional view taken along a line X4-X4 of FIG. 42, respectively.

The resin sealing portion 9 comprises, for example, an epoxy species resin. A center of the mold face of the wiring board 8 is mounted with, for example, a semiconductor chip (IC chip) 23a in a state of directing a main face to an upper side, further, two semiconductor chips (IC chips) 23b, 23c are laminated on the main face of the semiconductor chip 23a in a state of directing main faces thereof to the upper side. The respective semiconductor chips 23a through 23c include semiconductor boards comprising, for example, silicon (Si) or the like and the main faces are formed with desired circuits, mentioned later. Further, a vicinity of an outer periphery of the semiconductor chip 23a is arranged with a plurality of terminals 24 to surround the semiconductor chip 23a. The terminal 24 is constituted by subjecting an exposed surface of a metal foil of, for example, copper (Cu) or the like to nickel (Ni) matrix plating and gold (Au) plating or the like and is electrically connected to the external terminal 8a by way of a wiring of the wiring board 8.

The main face of the semiconductor chip 23a having the largest chip size is formed with, for example, an involatile memory circuit of a flash memory or the like capable of erasing and writing data electrically. A storing capacity of the semiconductor chip 23a is made to be a largest capacity in comparison with memory portions of the other semiconductor chips 23b, 23c. A bonding pad (hereinafter, simply referred to as pad) BP of the main face of the semiconductor chip 23a is electrically connected to the terminal 24 by way of a bonding wire (hereinafter, simply referred to as wire) BW. The wire BW comprises a slender wire or the like of, for example, gold (Au). A plurality of pieces of memory cells constituting the memory circuit of the semiconductor chip 23a are constituted such that when electrons are injected to a floating gate or the like of the memory cell, a threshold voltage is increased, further, when electrons are drawn from the floating gate or the like, threshold voltage is reduced. The memory cell is stored with information in accordance with high or low of the threshold voltage relative to a voltage of a word line for reading data. Although not particularly limited, for example, an erased state is constituted by a state in which, for example, a threshold voltage of a memory cell transistor is low and a written state is constituted by a state in which the threshold voltage is high.

The main face of the semiconductor chip 23b is formed with, for example, an IC card microcomputer circuit. The IC card microcomputer circuit is a circuit having a function as a security controller and realizes a function of being acknowledged by an evaluating and acknowledging organization of ISO/IEC 15408 which can be utilized in, for example, an electronic settlement of accounts service. The IC card microcomputer circuit includes an integrated circuit of, for example, CPU (Central Processing Unit), mask ROM (Read Only Memory), RAM (Random Access Memory), EEPROM (Electrically Erasable Programmable ROM) and other operation circuit or the like. The mask ROM is stored with, for example, executing program, a code algorism or the like. The RAM includes, for example, a function as a memory for processing data. Further, the EEPROM includes a function as a memory for storing data. The IC card main body 15 transmits a predetermined acknowledgement certificate held by the EEPROM when there is a request for acknowledgement from a host and is made to be able to execute a succeeding communication processing on a condition of providing acknowledgement therefore. A program of operating the security processing is held by the mask ROM.

Figure 44:
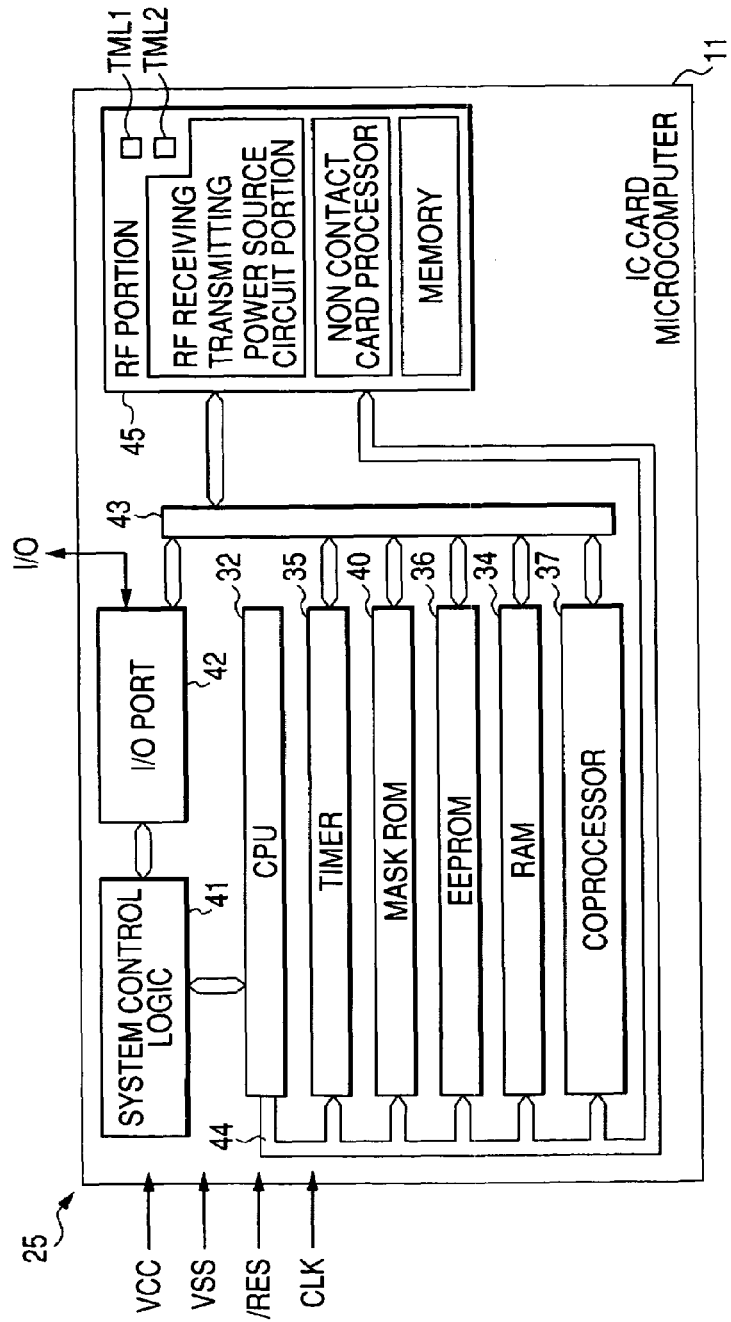
FIG. 44 is a circuit block diagram of an example of an IC card microcomputer circuit of an IC portion of an IC card.

FIG. 44 shows an example of an IC card microcomputer circuit in the semiconductor chip 23b. The IC card microcomputer circuit 25 includes CPU 25a, RAM 25b as work RAM, a timer 25c, EEPROM 25d, a coprocessor unit 25e, mask ROM 25f, a system control logic 25g, an input/output port (I/O port) 25h, data bus 25i and an address bus 25j.

The mask ROM 25f is utilized for storing operation program (coded program, decoding program, interface control program and the like) and data of CPU 25a. The RAM 25b is constituted as a work area or a region of temporarily storing data of CPU 25a and comprises, for example, SRAM or DRAM. When IC card command is supplied to the I/O port 25h, the system control logic 25g decodes the command and makes CPU 25a execute a processing program necessary for executing the command. That is, CPU 25a makes access to the mask ROM 25f by an address instructed from the system control logic 25g to fetch an instruction, decodes the fetched instruction and fetches an operand based on a decoded result or calculates data. The coprocessor unit 25e executes RSA or a remainder calculating processing in elliptical curve code calculation in accordance with a control of CPU 25a.

The I/O port 25h includes an input/output terminal I/O of 1 bit and is used both for inputting and outputting data and inputting an external interruption signal. The I/O port 25h is coupled to the data bus 25i, and the data bus 25i is electrically connected with CPU 25a, RAM 25b, the timer 25c, EEPROM 25d and the coprocessor unit 25e and the like.

The system control logic 25g executes a control of an operational mode and a control of interruption of the IC card microcomputer circuit 25 and includes a random number generating logic or the like utilized for generating a code key. When reset operation is instructed to the IC card microcomputer 25 by a reset signal/RES, inside thereof is initialized, and CPU 25a starts to execute an instruction from a top address of a program of EEPROM 25d. The IC card microcomputer circuit 25 is operated in synchronism with a clock signal CLK.

The EEPROM 25d is used as a region made to be able to execute an erasing processing and a writing processing electrically for storing ID (Identification) information, and an acknowledgement certificate or the like used for specifying an individual. In place of EEPRPM 25d, a flash memory or a ferromagnetic memory or the like may be adopted. The IC card microcomputer circuit 25 supports a contact interface using an external terminal for interface with outside.

Next, the main face of the semiconductor chip 23c shown in FIG. 42 and FIG. 43 is formed with, for example, an interface controller circuit. The interface controller circuit is provided with a function of controlling external interface operation and memory interface operation in accordance with a control mode in accordance with instruction from outside, or setting previously determined at inside thereof. The interface control mode provided to the IC card main body 15 is made to constitute, for example, MMC (including RS-MMC) mode. The function of the interface control circuit is constituted by recognition of a memory card interface control mode in accordance with a command exchanged with outside by way of an external connecting terminal or a state of the bus, switching a bus width in accordance with the recognized memory card interface control mode, conversion of a data format in accordance with the recognized memory card interface control mode, a power on resetting function, a control of an interface with the IC card microcomputer circuit at inside of the semiconductor chip 23b, a control of an interface with the memory circuit at inside of the semiconductor chip 23a, and conversion of a power source voltage or the like.

Figure 45:
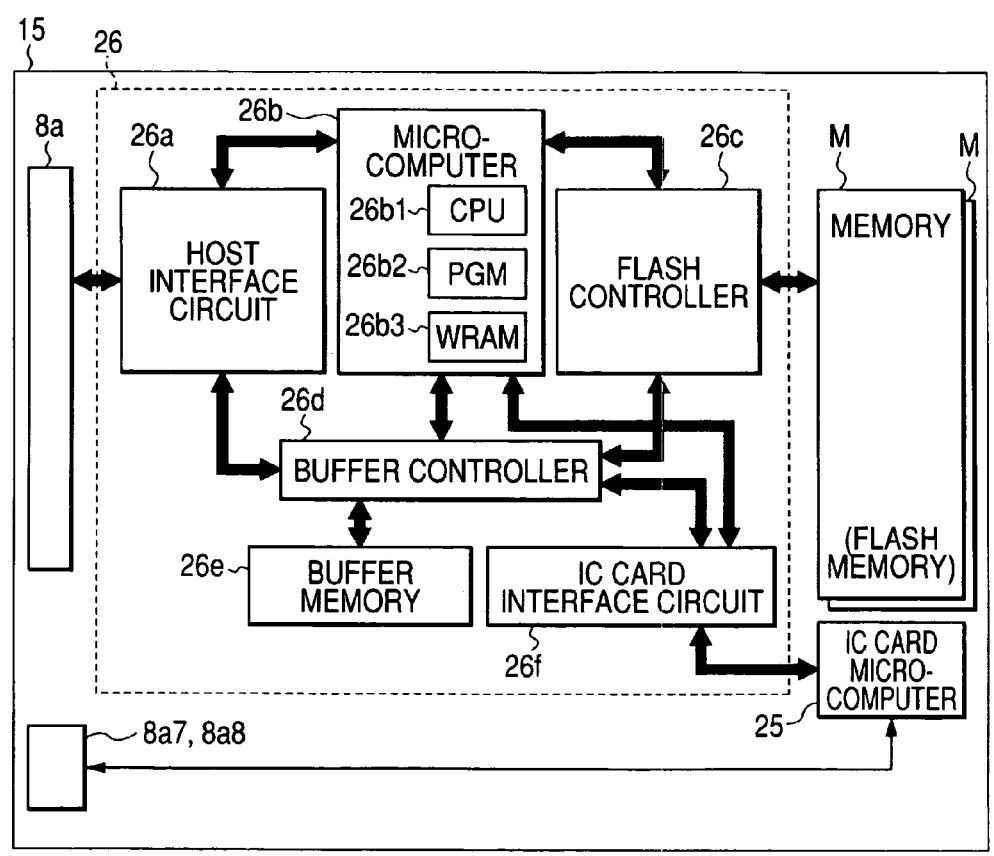
FIG. 45 is a circuit block diagram of an example of an interface controller circuit of an IC portion of an IC card.

FIG. 45 shows an example of the interface controller circuit 26. Further, a memory circuit M in FIG. 37 shows a memory circuit formed at the semiconductor chip 23a. The interface controller circuit 26 includes a host interface circuit 26a, a microcomputer 26b, a flash controller 26c, a buffer controller 26d, a buffer memory 26e and an IC card interface circuit 26f. The buffer memory 26e comprises DRAM, SRAM or the like. The IC card interface circuit 26f is electrically connected with an IC card microcomputer circuit 25. The microcomputer 26b includes CPU (Central Processing Unit) 26b1, a program memory (PGM) 26b2 holding an operation program of CPU 26b1 and a work memory (WRAM) 2663 utilized for the work region of CPU 26b1. A control program of an interface control mode in correspondence with SD card, MMC (including RS-MMC) is held by the program memory 26b2.

The host interface circuit 26a makes a control program of the interface control mode in correspondence with the microcomputer 26b executable by interruption when issuance of memory card initialize command or the like is detected. By executing the control program, the microcomputer 26b controls external interface operation by the host interface circuit 26a, controls access (write, erase and read operation) to the memory circuit M by the flash controller 26c and data control, and controls a format conversion between a data formant inherent to the memory card and a common data format to the memory by the buffer controller 26d. The buffer memory 26e is temporarily held with data read from the memory circuit M or data written to the memory circuit M. The flash controller 26c operates the memory circuit M as a file memory exchanged with a hard disk and controls data by a unit of sector. Further, the flash controller 26c includes an ECC circuit, not illustrated, for adding an ECC code in storing data to the memory circuit M and executes an error detecting and correcting processing by the ECC code for the read data.

Further, although in the above-described example, an explanation has been given of a case in which the IC card microcomputer circuit and the interface control circuit and the memory circuit are separately formed at the semiconductor chips 23a through 23c, the invention is not limited thereto but, for example, the IC card microcomputer circuit and the interface control circuit may be formed at one semiconductor chip. Further, the IC card microcomputer circuit and the interface controller circuit and the memory circuit may be formed at one semiconductor chip.

Figure 46:
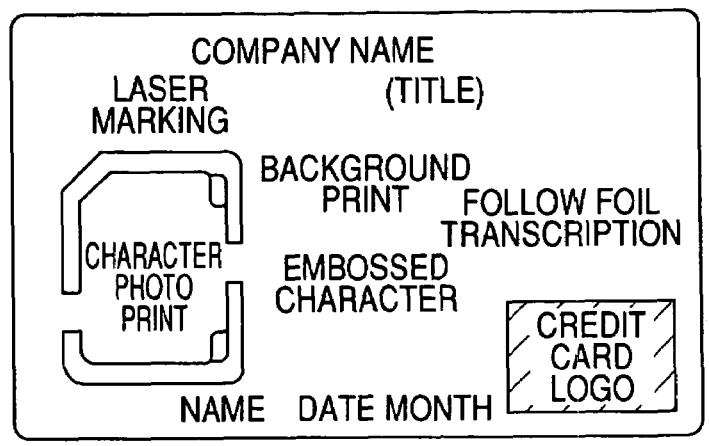
FIG. 46 is a plane view of a total showing a display example of information of a first main face of an IC card.
Figure 47:
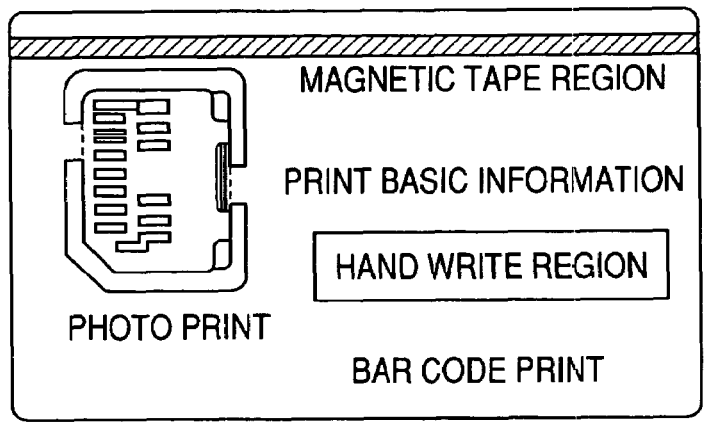
FIG. 47 is a plane view of a total showing a display example of information of a second main face of an IC card.
Figure 48:
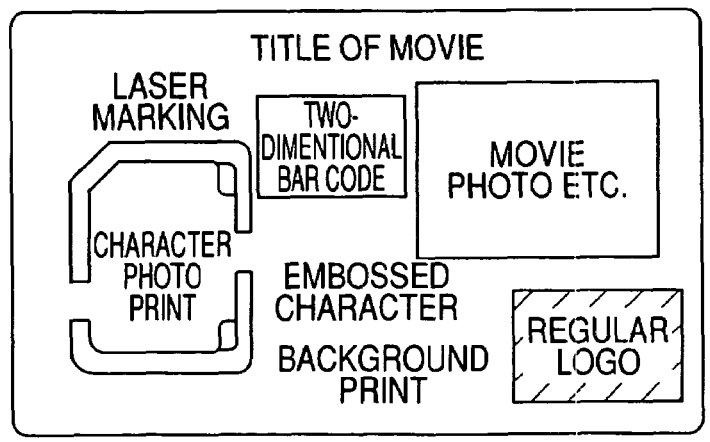
FIG. 48 is a plane view of a total showing a display example of information of a first main face of an IC card.

Next, FIG. 46 through FIG. 48 show a display example of information (the common information and the identification information) of the IC card 1CD. FIG. 46 and FIG. 48 show plane views of a total of the first main face of the IC card 1CD and FIG. 47 shows a plane view of a total of the second main face of the IC card 1CD.

FIG. 46 and FIG. 47 shows a display example when used for, for example, a credit card, a cash card, a card for ETC system, a commutation pass, a card for a portable telephone or an acknowledgement card or the like. Other than print of a character and a photograph, the card is subjected to background print, follow foil transcription or the like, and is provided with high acknowledgment performance and security performance. Further, similar to a general IC card, laser marking, embossed character, magnetic tape region, bar code print portion, hand write region or the like can also be formed.

Further, FIG. 48 shows a display example when the card is used as a card having high amusement performance of, for example, movie, music, game software or the like. For example, a photograph or the like of one scene or a movie recorded to the memory circuit M of the IC card main body 15 can be displayed on the surface of the IC card 1CD (frame member portion 1CB1, cap portion 1CB3). Therefore, a content of a work (movie, music, game or the like) recorded to the IC card main body 15 can simply be confirmed visually.

Embodiment 2

In Embodiment 2, an explanation will be given of an example when an IC card main body of, for example, mini SD standard is fabricated.

Figure 49:
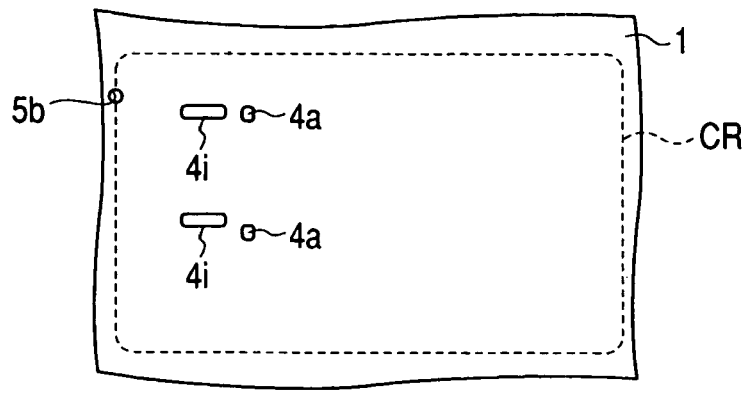
FIG. 49 is a plane view of an essential portion of a second main face of a card board in a step of fabricating an IC card according to other embodiment of the invention.
Figure 50:
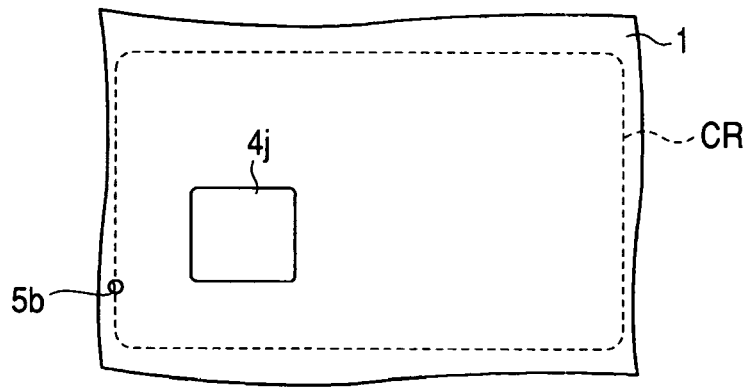
FIG. 50 is a plane view of an essential portion of a second main face of a card board in a step of fabricating an IC card continued from FIG. 49.
Figure 51:
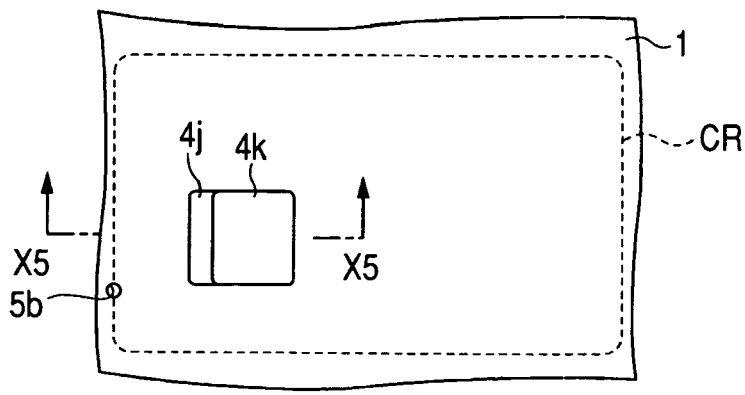
FIG. 51 is a plane view of an essential portion of a second main face of a card board in a step of fabricating an IC card continued from FIG. 50.
Figure 52:
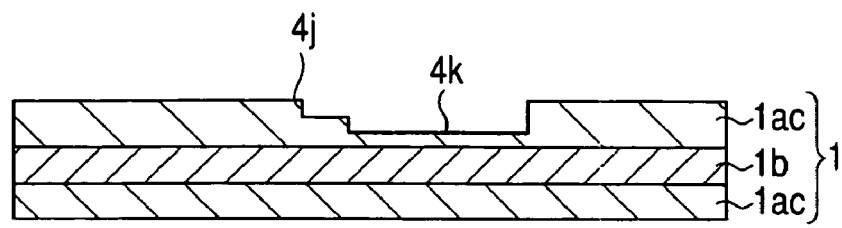
FIG. 52 is an enlarged sectional view taken along a line X5-X5 of FIG. 51.
Figure 53:
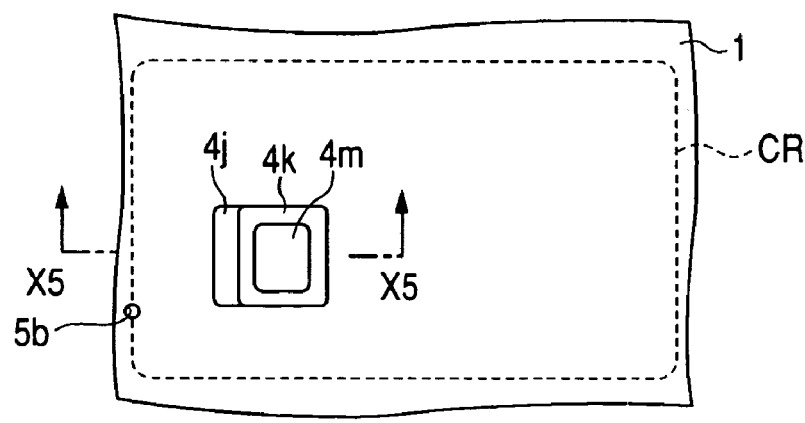
FIG. 53 is a plane view of an essential portion of a second main face of a card board in a step of fabricating an IC card continued from FIG. 51.
Figure 54:
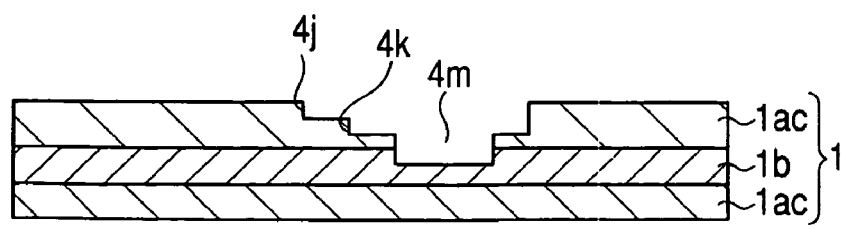
FIG. 54 is an enlarged sectional view taken along a line X5-X5 of FIG. 53.
Figure 55:
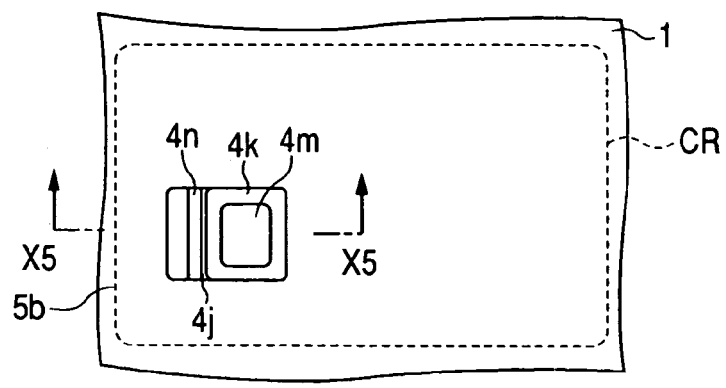
FIG. 55 is a plane view of an essential portion of a second main face of a card board in a step of fabricating an IC card continued from FIG. 53.
Figure 56:
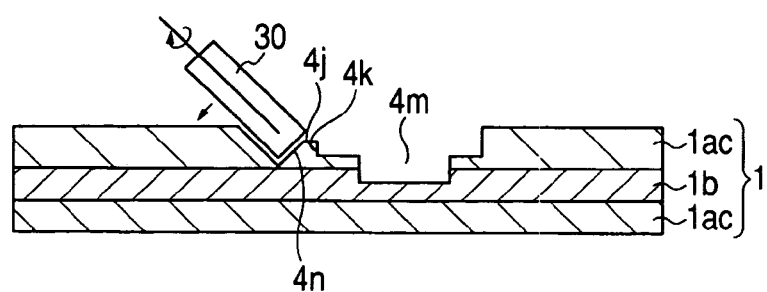
FIG. 56 is an enlarged sectional view taken along a line X5-X5 of FIG. 55.

First, a card board 1 subjected to a printing processing is prepared similar to Embodiment 1, and the card board 1 is subjected to cutting similar to Embodiment 1. That is, as shown by FIG. 49, after forming the positioning holes 5b for the respective card regions CR of the card board 1, the recess portions 4a, 4i are formed for the respective card regions CR of the first main face of the card board 1. FIG. 49 shows a plane view of an essential portion of the first main face of the card board 1. The recess portion 4i is a portion constituting a guide portion when the IC card main body is mounted to an electronic apparatus. Successively, after finishing to machine all of the card regions CR of the first main face of the card board 1, the card board 1 is turned back, as shown by FIG. 50, the shallow recess portions 4j are formed for the respective card regions CR of the second main face of the card board 1. FIG. 50 shows a plane of an essential portion of the second main face of the card board 1 of FIG. 49. The recess portion 4j is a cavity portion for constituting a reference height of the surface of the external terminal. Successively, as shown by FIG. 51 and FIG. 52, the deep recess portions 4k are formed for the respective card regions CR of the second main face of the card board 1. FIG. 51 shows a plane view of an essential portion of the second main face of the card board 1, FIG. 52 shows a sectional view taken along a line X5-X5 of FIG. 51, respectively. The recess portion 4k is a cavity portion of the wiring board of the IC portion. Successively, as shown by FIG. 53 and FIG. 54, the deep recess portions 4m are formed for the respective card regions CR of the second main face of the card board 1. FIG. 53 shows a plane view of an essential portion of the second main face of the card board 1, FIG. 54 shows a sectional view taken along a line X5-X5 of FIG. 53, respectively. The recess portion 4m is a portion containing the resin sealing portion of the IC portion. Successively, as shown by FIG. 55 and FIG. 56, the taper portions 4n are machined for the respective card regions CR of the second main face of the card board 1. FIG. 55 shows a plane view of an essential portion of the second main face of the card board 1, FIG. 56 shows a sectional view taken along a line X5-X5 of FIG. 55. FIG. 56 exemplifies a behavior of forming the taper portion 4n by an end mill tool 30 a main axis of which is skewedly inclined to the main face of the card board 1 (steps 100, 101). By forming the taper portion 4n, the IC card main body can smoothly be inserted into the electronic apparatus.

Figure 57:
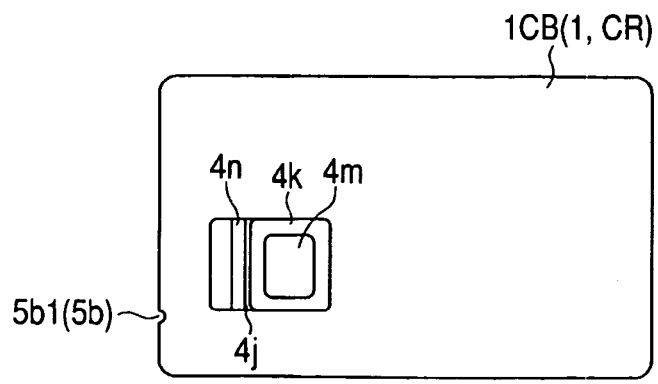
FIG. 57 is a plane view of a total of a second main face of a card main body in a step of fabricating an IC card continued from FIG. 55.
Figure 58:
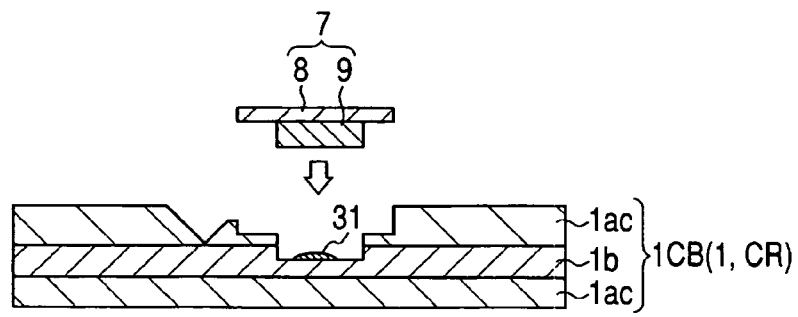
FIG. 58 is a sectional view enlarging an essential portion of a card main body in a step of fabricating an IC card continued from FIG. 57.
Figure 59:
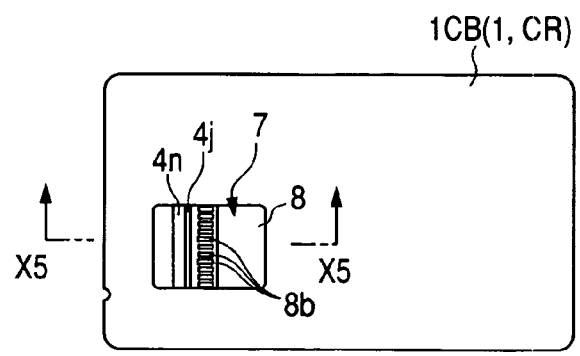
FIG. 59 is a plane view of a total of a second main face of a card main body in a step of fabricating an IC card continued from FIG. 57.
Figure 60:
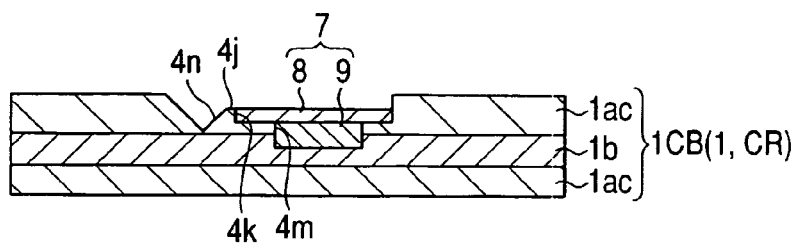
FIG. 60 is an enlarged sectional view taken along a line X5-X5 of FIG. 59.

Successively, as shown by FIG. 57, the individual card regions CR are cut out from the card board 1 by punching (step 102). FIG. 57 shows a plane view of a total of the second main face of the card member 1CB cut out from the card board 1. Successively, after printing the identification information (second information) to the card member 1CB similar to Embodiment 1 (step 103), as shown by FIG. 58 through FIG. 60, the IC portion 7 is fixed by a liquid state or a sheet-like adhering member 31 in a state of being fitted to the recess portions 4k, 4m of the second main face of the card member 1CB (step 104). FIG. 58 shows a sectional view of an essential portion of the card member 1CB in the step of pasting the IC portion 7, FIG. 59 shows a plane view of a total of the second main face of the card member 1CB after the step of pasting the IC portion 7, FIG. 60 is a sectional view taken along a line X5-X5 of FIG. 59, respectively. The IC portion 7 is pasted thereto in a state in which the resin sealing portion 9 is contained in the recess portion 4m of the second main face of the card member 1CB, and the back face of the wiring board 8 is surfaced to outside. The back face (surfaced face) of the wiring board 8 is arranged with, for example, 11 pieces of the external terminals 8b.

Figure 61:
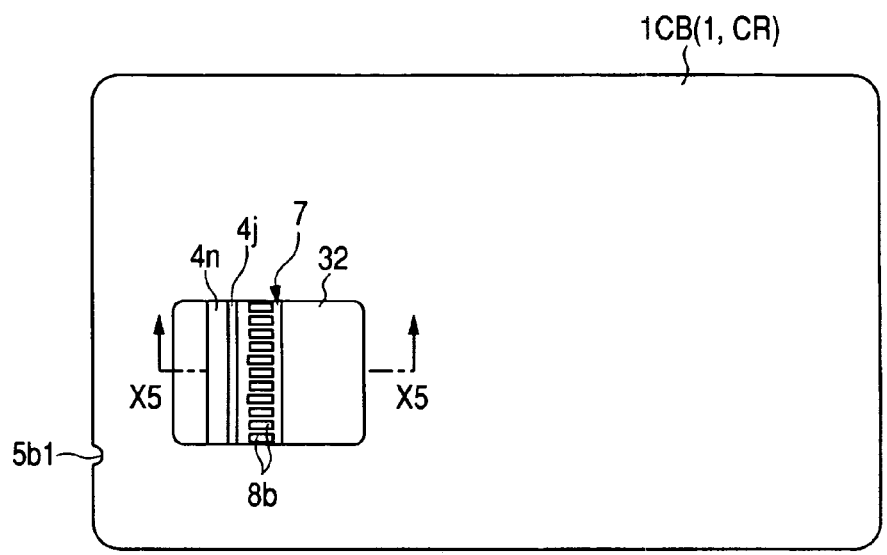
FIG. 61 is a plane view of a total of a second main face of a card main body in a step of fabricating an IC card continued from FIG. 59.
Figure 62:
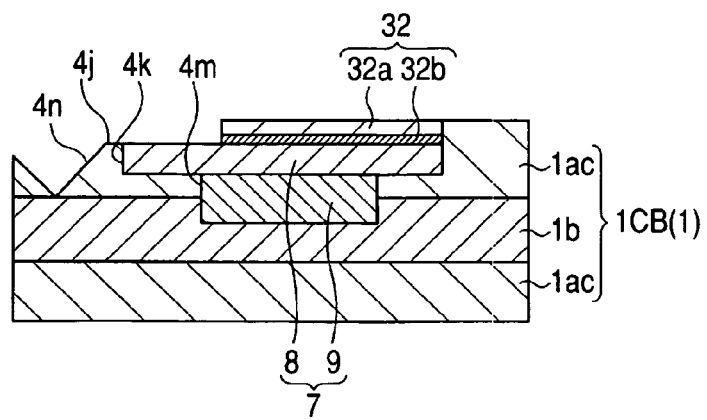
FIG. 62 is an enlarged sectional view taken along a line X5-X5 of FIG. 61.

Next, similar to Embodiment 1, desired data is electrically written to the semiconductor chip of the IC portion 7 (step 105). Similar to Embodiment 1, after the data writing processing, a simple test may be carried out for the IC portion 7. Successively, as shown by FIG. 61 and FIG. 62, a back face label 32 is pasted to the back face (surfaced face) of the IC portion 7 of the second main face of the card member 1CB. FIG. 61 shows a plane view of an essential portion of the second main face of the card member 1CB, FIG. 62 shows a sectional view taken along a line X5-X5 of FIG. 61, respectively. The back face label 32 is provided with a function of reducing a stepped difference at the IC portion 7 of the second main face of the card member 1CB, a surface protecting function of protecting the IC portion 7 against impact from outside, moisture or the like, an insulation protecting function for electrically protecting the IC portion 7 and a display function. The back face label 32 includes a label main body 32 comprising, for example, plastic, and an adhering layer 32b of the back face thereof and is pasted to the wiring board 8 of the IC portion 7 by an adhering force of the adhering layer 32b of the back face.

Figure 63:
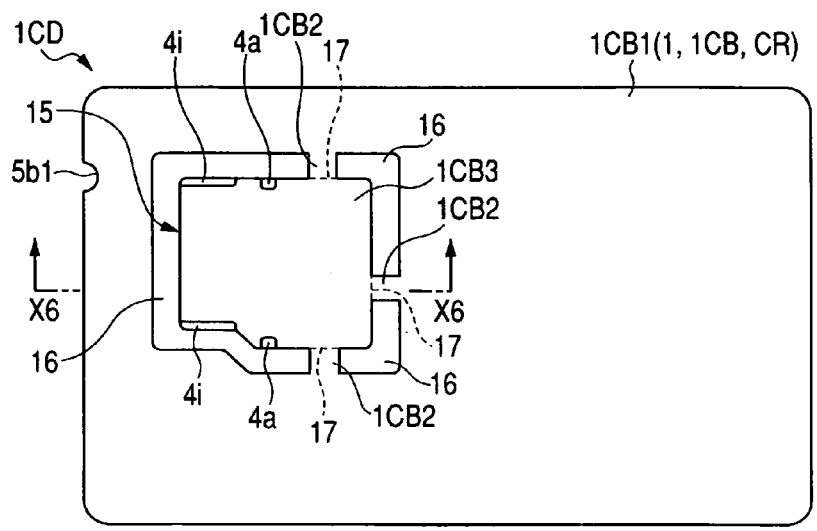
FIG. 63 is a plane view of a total of a first main face of an IC card according to other embodiment of the invention.
Figure 64:
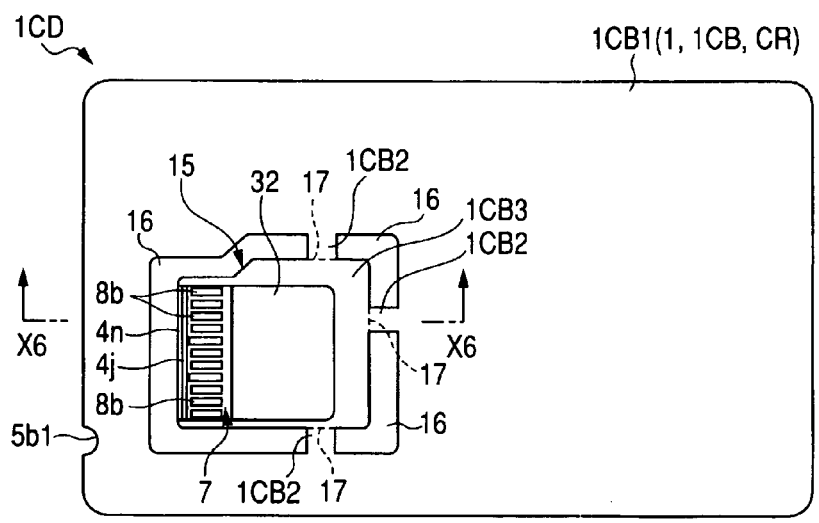
FIG. 64 is a plane view of a total of a second main face of the IC card of FIG. 63.
Figure 65:
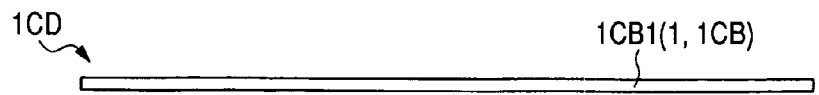
FIG. 65 is a side view of the IC card of FIG. 63 and FIG. 64.
Figure 66:
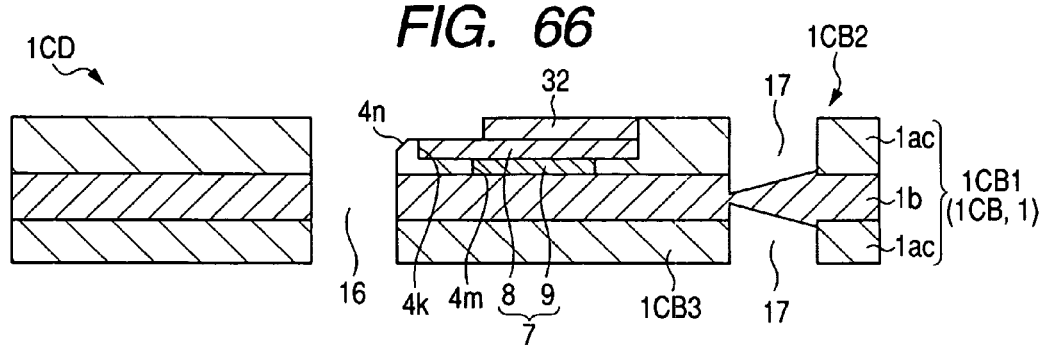
FIG. 66 is an enlarged sectional view taken along a line X6-X6 of FIG. 63 and FIG. 64.

Next, as shown by FIG. 63 and FIG. 64, a portion of the card board 1 at the outer periphery of the IC card main body 15 of the card member 1CB is punched by punching or the like (step 106). Thereby, the IC card 1CD having the IC card main body 15 of mini SD standard is formed. FIG. 63 shows a plane view of a total of the first main face of the IC card 1CD, FIG. 64 shows a plane view of a total of the second main face of the IC care 1CD, FIG. 65 shows a side view of the IC card 1CD of FIG. 63 and FIG. 64, FIG. 66 shows a sectional view taken along lines X6-X6 of FIG. 63 and FIG. 64, respectively. An order of executing the respective steps can be changed within the region not deviated from the gists of the steps.

Figure 67:
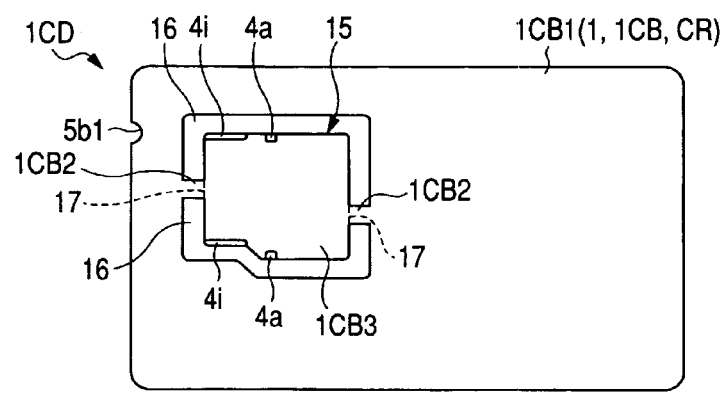
FIG. 67 is a plane view of a total of a first main face of an IC card according to other embodiment of the invention.
Figure 68:
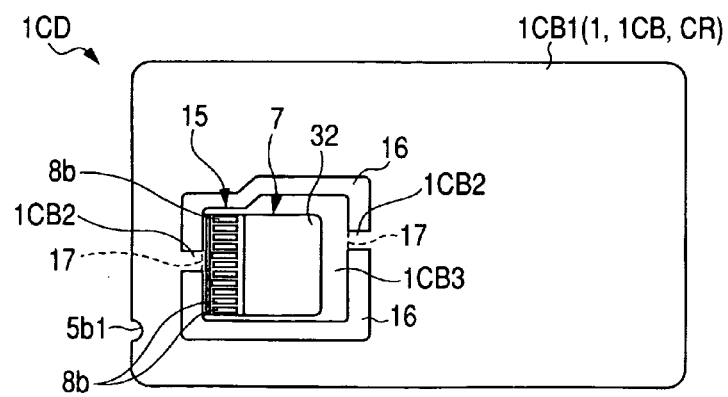
FIG. 68 is a plane view of a total of a second main face of the IC card of FIG. 67.

The outer shape dimension of the IC card 1CD is the same as that of Embodiment 1. According to Embodiment 2, the connecting portions 1CB2 are connected to the both side face of the cap portion 1CB3. In the case of the IC card main body 15 of mini SD standard, when the IC card main body 15 is mounted to and drawn out from the desired electronic apparatus, the guided portion formed by the recess portion 4i of the side face of the IC card main body 15 is formed to be in parallel with the direction of inserting the IC card and is slidingly moved in a state of bringing a rail portion at inside of the card slot of the desired electronic apparatus and the IC card main body mounting guide into contact with each other. Therefore, a state of a surface of the guide portion effects a significant influence in inserting and drawing out the card to and from the card slot. Further, the guide portion is significantly related to positional accuracy of the card at inside of the card slot. When dimensional accuracy of the guide portion is low, at inside of the card slot, a direction of aligning external terminals via narrow intervals is shifted to constitute a factor of bringing about a failure in contact or the like at inside of the card slot. In comparison therewith, a card front face constituting the head portion of the card inserting direction is not slidingly moved in a state of being inserted to inside of the card slot although the card front face may be impacted to an inner wall of the card slot. When the dimensional accuracy of the card front face is low, there is brought about a possibility of bringing about a positional shift in parallel with a card inserting and drawing direction by prolonging the shape of the external terminal in the direction in parallel with the card inserting and drawing direction, the failure in contact at inside of the card slot can be avoided. By such a situation, it is preferable to connect the connecting portion 1CB2 to at least a portion other than the guide portion. Further, it is further preferable to connect the connecting portions 1CB2 to the front face and the rear face of the card. Thereby, also in Embodiment 2, similar to Embodiment 1, the IC card main body 15 can be put in or out smoothly to and from the card slot of the desired electronic apparatus. Further, also in Embodiment 2, similar to Embodiment 1, the connecting portion 1CB2 is formed to avoid the taper portion 4n. Thereby, also in Embodiment 2, similar to Embodiment 1, a performance of facilitating to form the IC card 1CD can be promoted. However, as shown by, for example, FIG. 67 and FIG. 68, the connecting portions 1CB2 may be connected to respectives of the front face and the rear face of the IC card main body 15 by single portions thereof. The connecting portion 1CB2 of the front face of the IC card main body 15 is connected to a portion of forming the taper portion 4n substantially at a center in a short side direction of the IC card main body 15. Further, as has been explained in reference to FIG. 24 of Embodiment 1, the connecting portion 1CB2 may be gradually converged, or converged in steps to the IC card main body 15.

Also the IC card main body 15 of Embodiment 2 is an information medium having a high functional performance having both of the functions as a so-to-speak IC card capable of executing a security processing and the function as a so-to-speak memory card having a capacity larger than that of the IC card and a function higher than that of the IC card. Also a circuit constitution of the IC card main body 15 is substantially the same as that explained in Embodiment 1 and therefore, an explanation thereof will be omitted.

Figure 69:
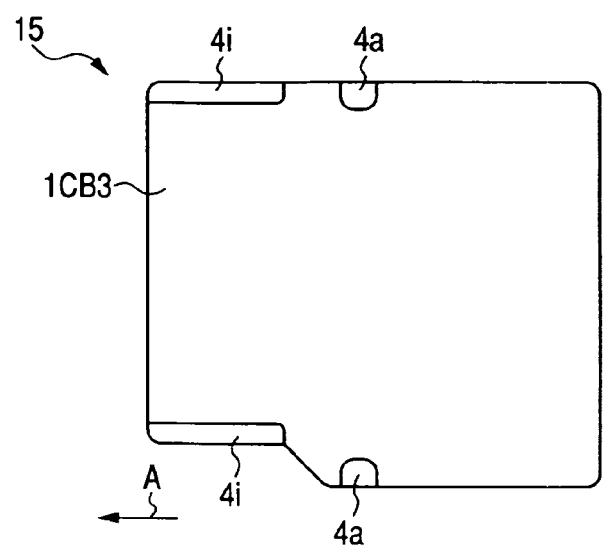
FIG. 69 is a plane view of a total of a first main face of an IC card main body cut out from the IC card of FIG. 63 through FIG. 66 or FIG. 67 and FIG. 68.
Figure 70:
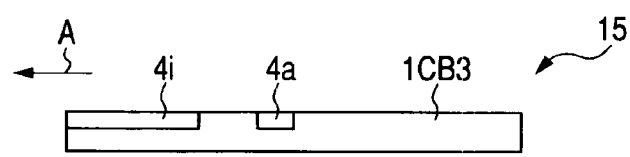
FIG. 70 is a side view when the IC card main body of FIG. 69 is viewed from a lower side.
Figure 71:
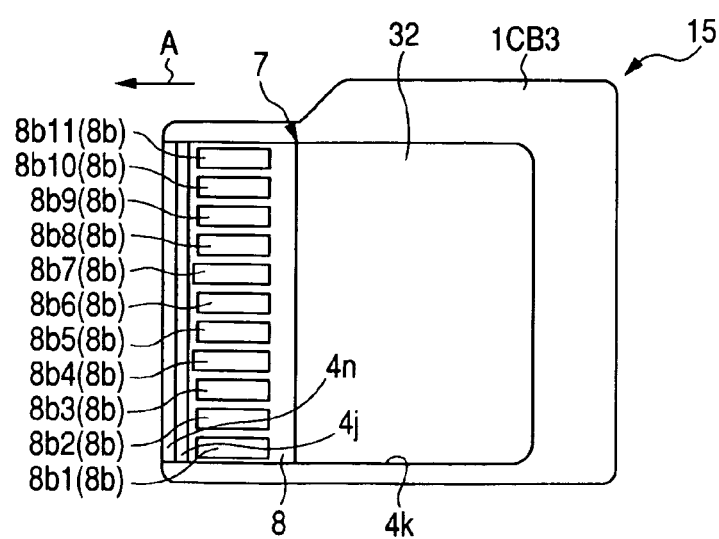
FIG. 71 is a plane view of a total of a second main face of the IC card main body of FIG. 69.

FIG. 69 through FIG. 71 show a behavior when the IC card main body 15 is cut out from the IC card 1CD. FIG. 69 shows a plane view of a total of the first main face of the IC card main body 15, FIG. 70 shows a side view when the IC card main body of FIG. 69 is viewed from a lower side, FIG. 71 shows a plane view of a total of the second main face (face on an opposed side of the first main face) of the IC card main body 15, respectively. The outer shape of the IC card main body 15 according to Embodiment 2 is formed in compliance with, for example, standard of mini SD. That is, the outer shape dimension of the IC card main body 15 of Embodiment 2 is, for example, about 21.5 mm×20 mm×1.4 mm. Further, the IC card main body 15 is formed by a shape in which a width on the front face side is shorter than a width on the rear face side. Further, the first main face of the cap portion 1CB3 of the IC card main body 15 is formed with the recess portions 4a, 4i, and the second main face of the cap portion 1CB3 is formed with the recess portions 4j, 4k, 4m and the taper portion 4n. The recess portion 4a is formed at the side face of the IC card main body 15, the recess portion 4*i* is extended to be formed at the side face on the front face side of the IC card main body 15, the recess portion 4*j* and the taper portion 4*n* are formed at the front face of the IC card main body 15. However, different from general mini SD, the surfaces (the first main face and the second main face) of the cap portion 1CB3 are displayed with information of a character, a pattern, a diagram or a face photograph or the like which is finer and clearer and provided with higher acknowledgement performance, security performance and outlook. Further, corner portions of the respective recess portions 4*a*, 4*i* through 4*k*, 4*m* are formed with rounded tapers to construct a constitution in which it is difficult to bring about a crack constituting onsets by the corner portions of the recess portions 4*a*, 4*i* through 4*k*, 4*m*. Also in the case of Embodiment 2, the recess portion 4*a* is the same as that explained in reference to FIG. 35 or the like of Embodiment 1. Further, the recess portion 4*i* is a portion constituting a guide when the IC card main body 15 is mounted to or drawn out from the electronic apparatus as described above.

The contact face of the wiring board 8 of the IC portion 7 of the IC card main body 15 according to Embodiment 2 are aligned to be arranged with, for example, 11 pieces of the external terminals 8*b* (8*b*1 through 8*b*11) in a state of being proximate to each other. A material, a function or the like of the external terminal 8*b* is similar to that of the external terminal 8*a*. Although not particularly limited, allocation of signals or the like of the respective external terminals 8*b* is, for example, as follows. That is, the external terminals 8*b*1, 8*b*10, 8*b*11 are, for example, terminals for data, the external terminal 8*b*2 is a terminal for, for example, detecting the card or for data, the external terminal 8*b*3 is a terminal for, for example, command (CMD), the external terminal 8*b*4 is a terminal for, for example, a power source for supplying the power source voltage Vss1 on the low potential side, the external terminals 8*b*5, 8*b*6 are nonconnect (NC) terminals which are not allocated currently although the terminals can be utilized in the future, the external terminal 8*b*7 is a terminal for, for example, a power source for supplying a power source voltage Vdd on the high potential side, the external terminal 8*a*8 is a terminal for, for example, inputting the clock signal (CLK), the power source terminal 8*a*9 is a terminal for, for example, a power source for supplying a power source voltage Vss2 on the low potential side.

Also in Embodiment 2, an effect similar to that of Embodiment 1 can be achieved.

Embodiment 3

Figure 72:
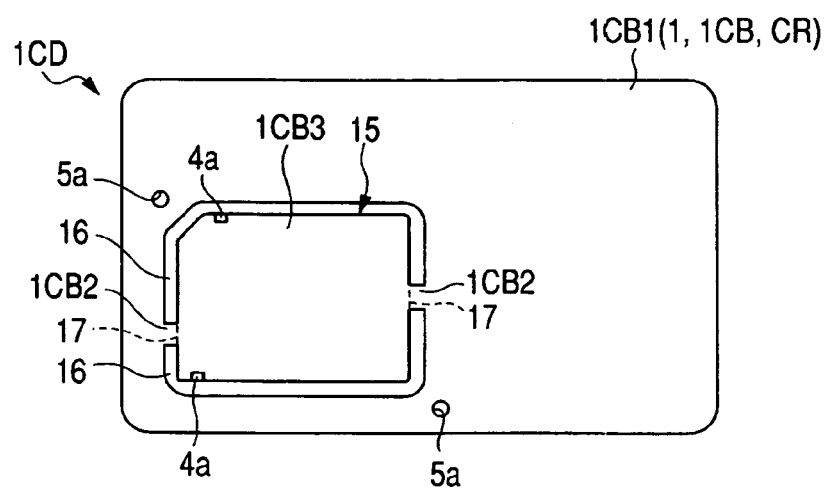
FIG. 72 is a plane view of a total of a first main face of an IC card according to other embodiment of the invention.
Figure 73:
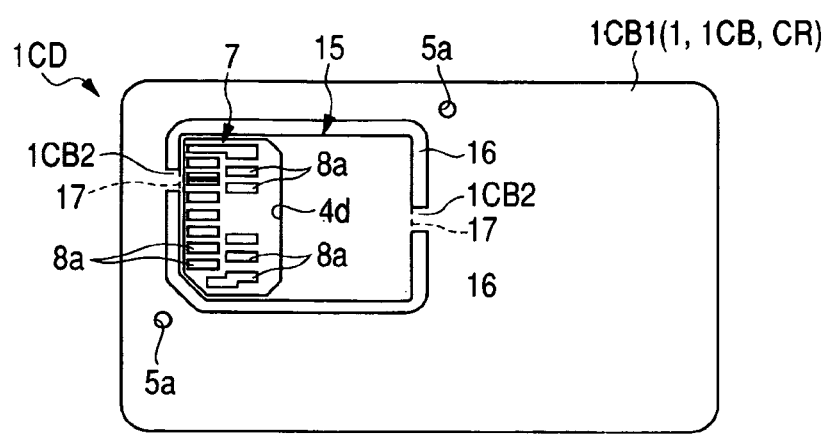
FIG. 73 is a plane view of a total of a second main face of the IC card of FIG. 72.
Figure 74:
FIG. 74 is a side view of the IC card of FIG. 72 and FIG. 73.

In Embodiment 3, an explanation will be given of an example of being applied to HS-MMC (High SpeedMulti Media Card) standard of full size. FIG. 72 is a plane view of a total of a first main face of the IC card 1CD according to Embodiment 3, FIG. 73 is a plane view of a total of a second main face of the IC card 1CD of FIG. 72, FIG. 74 is a side view of the IC card 1CD of FIG. 72 and FIG. 73.

The outer shape dimension of the IC card 1CD according to Embodiment 3 is similar to that of Embodiment 1. However, the outer shape dimension of the IC card main body 15 according to Embodiment 3 is, for example, 32 mm×24 mm×1.4 mm which is larger than that in the case of Embodiment 1. In the case of the IC card main body 15 of Embodiment 3, it is not necessary to mount a card adapter and therefore, recess portions therefor are not formed at the first main face and the second main face of the cap portion 1CB3, however, the recess portions 4*a*, 4*d*, 4*h* are formed at the first main face and the second main face of the cap portion 1CB3. Although here, there is exemplified a case of mounting the IC portion 7 of RS-MMC standard, the invention is not limited thereto but the IC portion of MMC standard of full size may be mounted thereto. When the IC portion 7 of RS-MMC standard is mounted, in comparison with a case of mounting the IC portion of MMC standard of full size, a weight of the IC card main body 15 can be reduced. The IC portion can be used for RS-MMC standard and full size MMC standard and therefore, time of fabricating the IC card main body 15 can be shortened, further, cost of the IC card main body 15 can be reduced.

Also in Embodiment 3, an effect similar to that of Embodiment 1 can be achieved.

Embodiment 4

Figure 75:
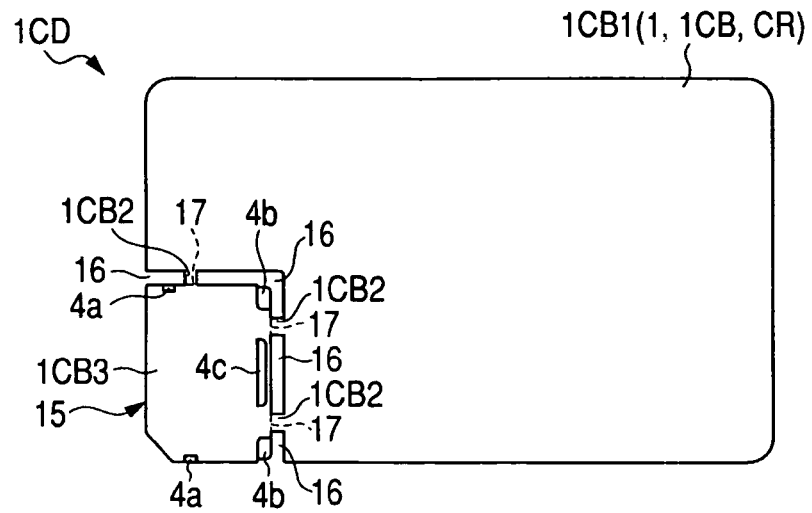
FIG. 75 is a plane view of a total of a first main face of an IC card according to other embodiment of the invention.
Figure 76:
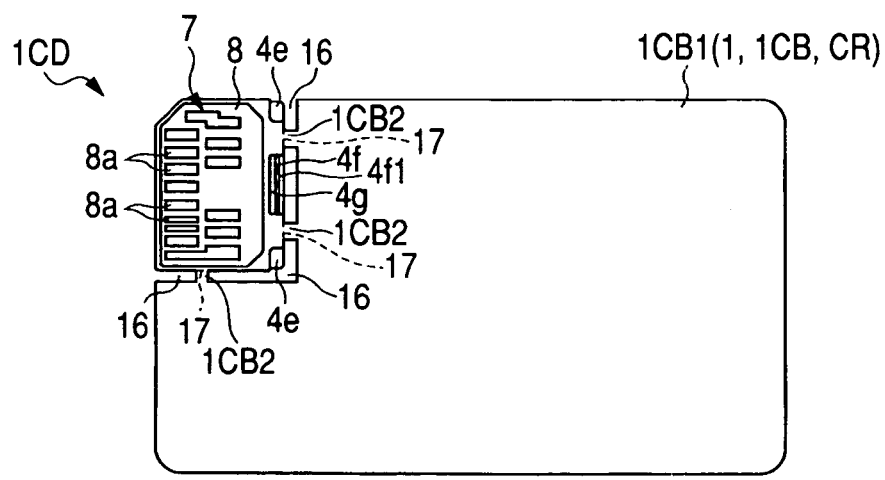
FIG. 76 is a plane view of a total of a second main face of the IC card of FIG. 75.
Figure 77:
FIG. 77 is a side view of the IC card of FIG. 75 and FIG. 76.

FIG. 75 through FIG. 77 show the IC card 1CD of Embodiment 4. FIG. 75 shows a plane view of a total of a first main face of the IC card 1CD according to Embodiment 4, FIG. 76 shows a plane view of a total of a second main face of the IC card 1CD of FIG. 75, FIG. 77 shows a side view of the IC card 1CD of FIG. 75 and FIG. 76, respectively.

According to Embodiment 4, the IC card main body 15 is attached to a corner portion of the IC card 1CD. Thereby, the IC card main body 15 can easily be cut out manually or by a simple cutting tool. In this case, the IC card main body 15 can be cut out comparatively cleanly, a residue of the connecting portion 1CB2 can be made to be difficult to be brought about at the IC card main body 15 and therefore, even when the connecting portion 1CB2 is connected to a portion of the side face of the IC card main body 15, the drawback as explained in Embodiment 1 can be reduced from being brought about.

Figure 78:
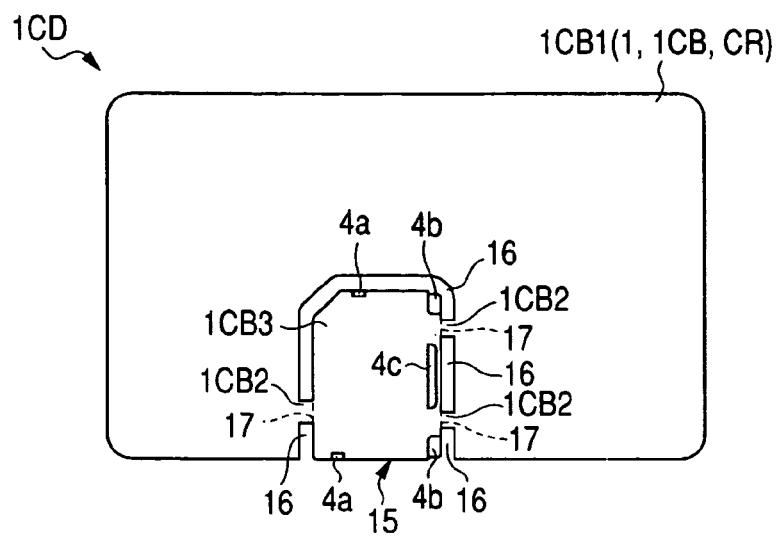
FIG. 78 is a plane view of a total of a first main face of an IC card according to other embodiment of the invention.
Figure 79:
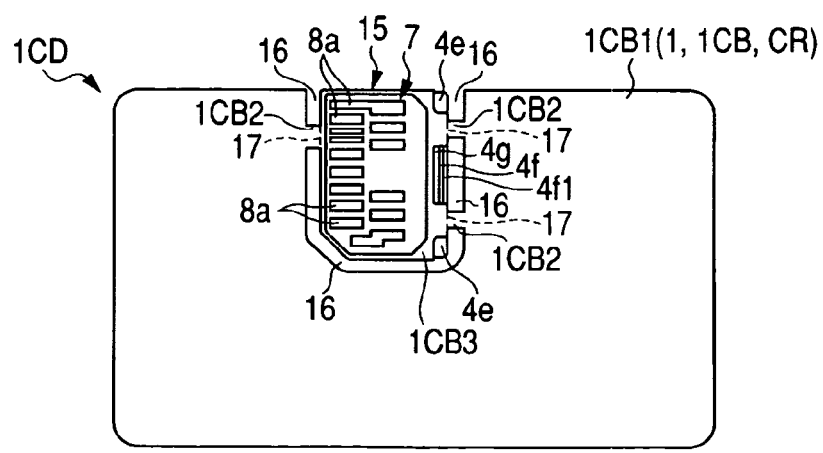
FIG. 79 is a plane view of a total of a second main face of the IC card of FIG. 78.
Figure 80:
FIG. 80 is a side view of the IC card of FIG. 78 and FIG. 79.

Further, the IC card 1CD may be constituted as shown by FIG. 78 through FIG. 80. FIG. 78 shows a plane view of a total of a first main face of the IC card main body 1CD according to Embodiment 4, FIG. 79 shows a plane view of a total of a second main face of the IC card 1CD of FIG. 78, FIG. 80 shows a side view of the IC card 1CD of FIG. 78 and FIG. 79, respectively.

According to the example, the IC card main body 15 is arranged more proximately to a center of a long side of the IC card 1CD than that in the case shown by FIG. 75 and FIG. 76. The frame member portion 1CB1 is formed by a plane recess shape, the IC card main body 15 is brought to the recess, and is held in a state of being hung by the connecting portion 1CB2. Further, a short side of the IC card main body 15 forms a portion of the long side of the IC card 1CD. Also in this case, the IC card main body 15 can more be facilitated to be cut out manually or the like than in the cases of Embodiments 1 through 3. Further, the connecting portions 1CB2 are connected to the front face and the rear face of the IC card main body 15 and therefore, cut residues of the connecting portions 1CB2 are not brought about at the side face of the IC card main body 15. Therefore, similar to Embodiment 1 or the like, the IC card main body 15 can smoothly be inserted into and taken out from the electronic apparatus.

Embodiment 5

Figure 81:
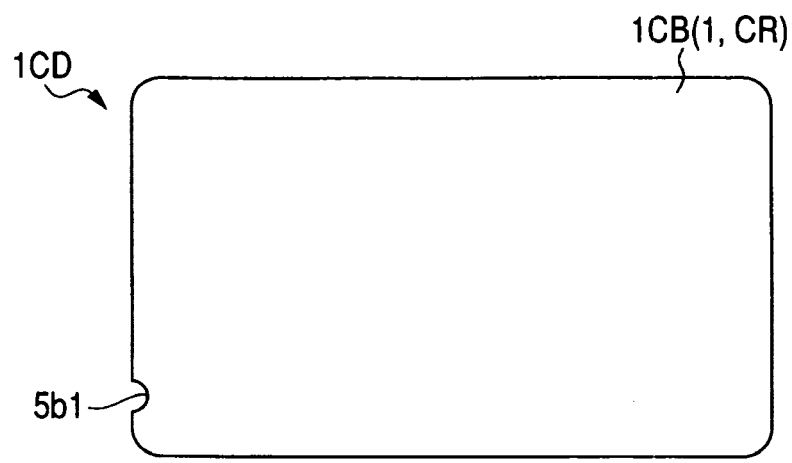
FIG. 81 is a plane view of a total of a first main face of an IC card according to other embodiment of the invention.
Figure 82:
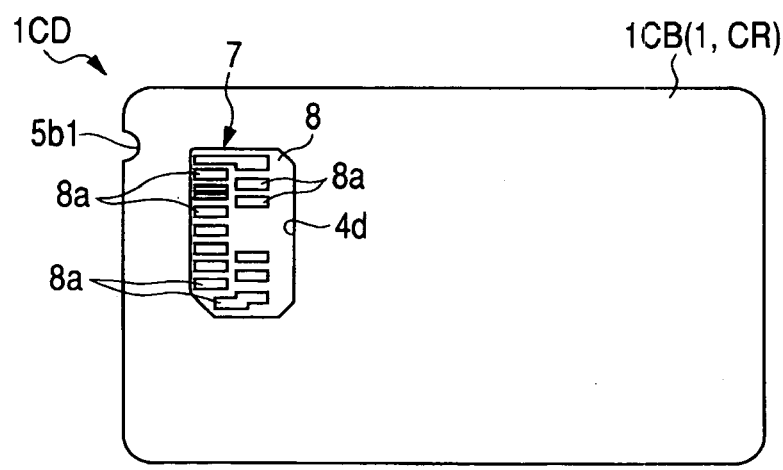
FIG. 82 is a plane view of a total of a second main face of the IC card of FIG. 81.
Figure 83:
FIG. 83 is a side view of the IC card of FIG. 81 and FIG. 82.

FIG. 81 through FIG. 83 show the IC card 1CD according to Embodiment 5. FIG. 81 shows a plane view of a total of a first main face of the IC card 1CD according to Embodiment 5, FIG. 82 is a plane view of a total of a second main face of the IC card 1CD of FIG. 81, FIG. 83 shows a side view of the IC card 1CD of FIG. 81 and FIG. 82, respectively.

Figure 1:
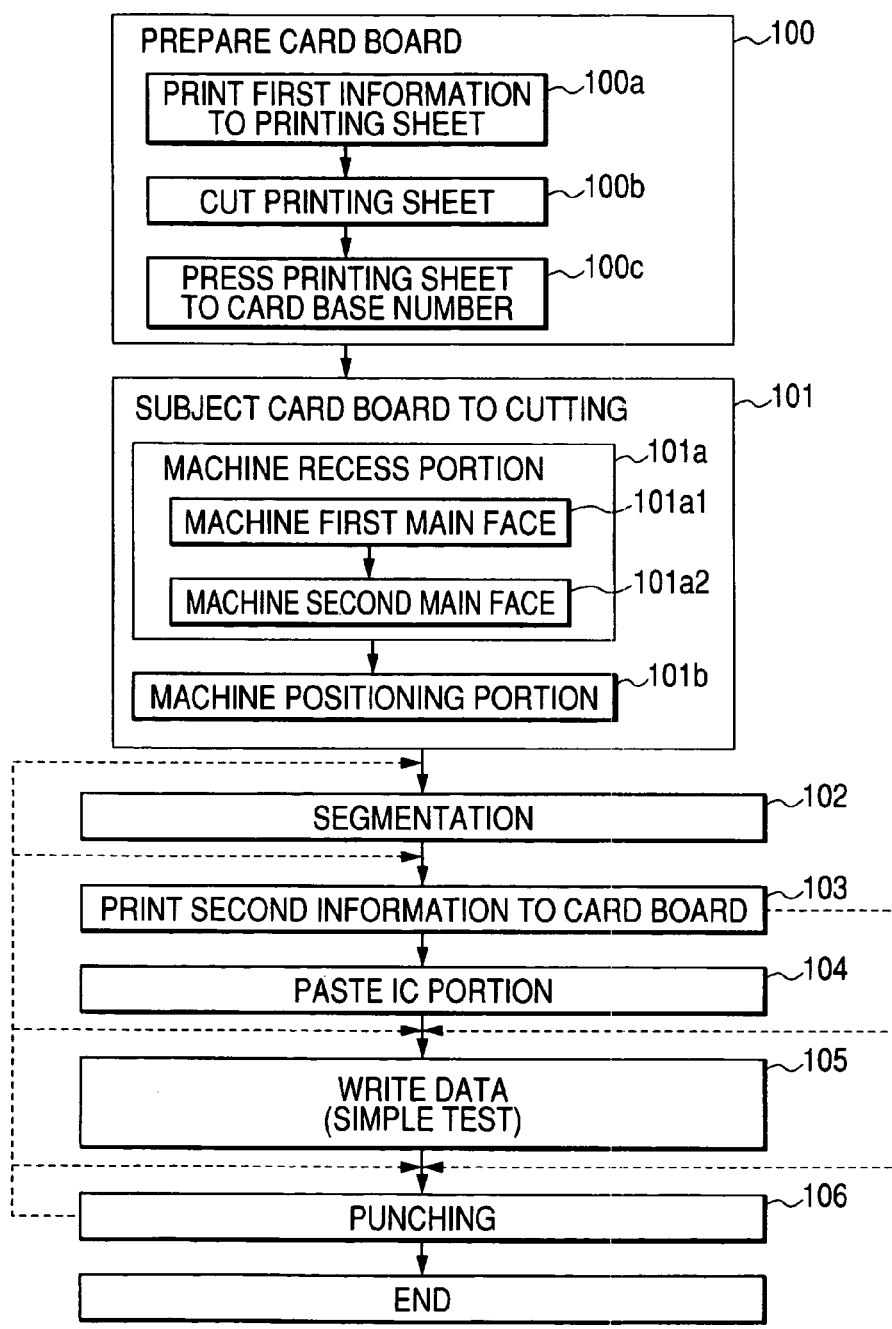
FIG. 1 is a flowchart of an example of steps of fabricating an IC card according to an embodiment of the invention.

Embodiment 5 is an example of when a finished product is constituted in a state in which the punching step 106 of FIG. 1 is not carried out. The IC portion 7 is fitted to be firmly fixed to the recess portions 4d, 4h (refer to FIG. 16 or the like) of the second main face of the card main body 1CB. Also in this case, the IC card 1CD having high acknowledgment performance, security performance and function can be provided.

Embodiment 6

According to Embodiment 6, the card board is prepared (step 100), subjected to cutting (step 101), thereafter, subjected to the step 104 of pasting the IC portion and the punching step 106, thereafter, subjected to the segmentation step 102. Further, thereafter, the step 103 of printing the identification information and the data writing step 105 are carried out. In this way, by carrying out the steps common to a plurality of IC cards summarizingly to the plurality of card regions CR of the card board 1 before being segmented, an operational efficiency of steps of fabricating the IC card can be promoted. On the other hand, by carrying out the step 103 of printing the identification information and the data writing step 105 after the segmentation step 102, erroneous display or erroneous description can be reduced or prevented from being brought about.

Figure 84:
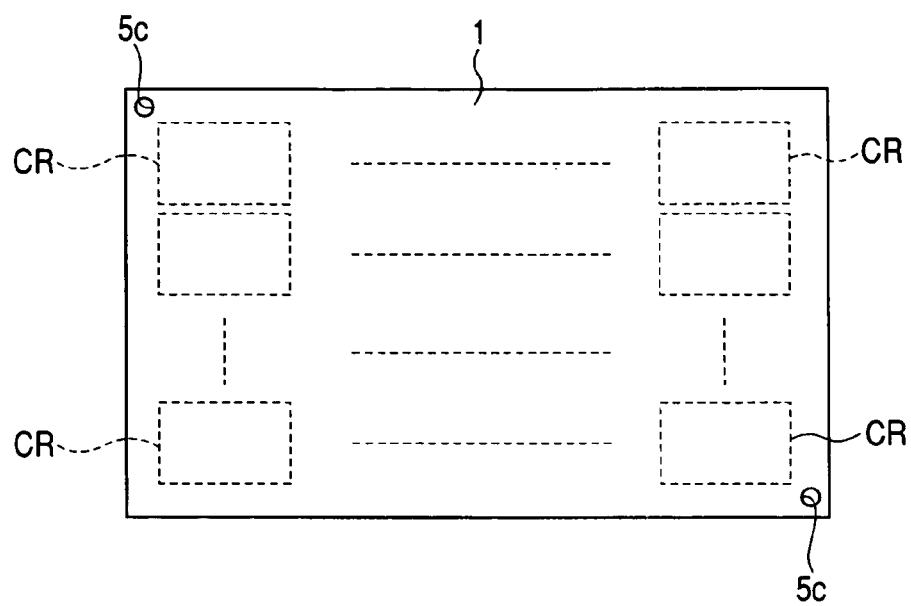
FIG. 84 is a plane view of a card board in a step of fabricating an IC card according to other embodiment of the invention.

Further, the segmentation step 102 may be carried out finally (after punching step 106 in FIG. 1). By summarizingly carrying out all the steps in this way to the plurality of card regions CR of the card board 1 before being segmented, the operational efficiency of the steps of fabricating the IC card can further be promoted. In this case, when the positioning holes 5a or the like are provided at respectives of the card regions CR of the card board 1, positioning becomes difficult and therefore, as shown by FIG. 84, positioning holes 5c may be provided at vicinities of diagonal portions of the card board 1, positioning with the fabricating apparatus of the respective steps may be carried out thereby. In this case, the positioning holes are not provided at the IC card 1CD per se and therefore, the regions of the character, the pattern or the like for the common information or the identification information is not deteriorated.

Although the specific explanation has been given of the invention carried out by the inventors based on the embodiments, the invention is not limited to the embodiments but can naturally be changed variously within the range not deviated from the gist.

For example, although in the step of forming the recess at the card, there is described the step of forming the individual recesses successively by the cutting processing by using a numerical control machine tool or the like, the step of forming the recess at the card can also be formed by a step of pressing or the like by a die.

FIG. 88 through FIG. 94 show a case of forming the step of forming the recess at the card by pressing by a die.

Figure 88:
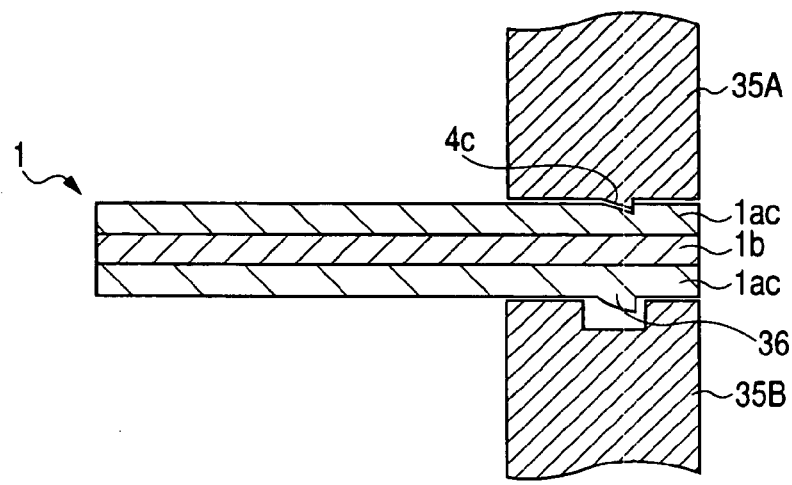
FIG. 88 is a sectional view of an essential portion in a step of fabricating an IC card according to other embodiment of the invention.
Figure 89:
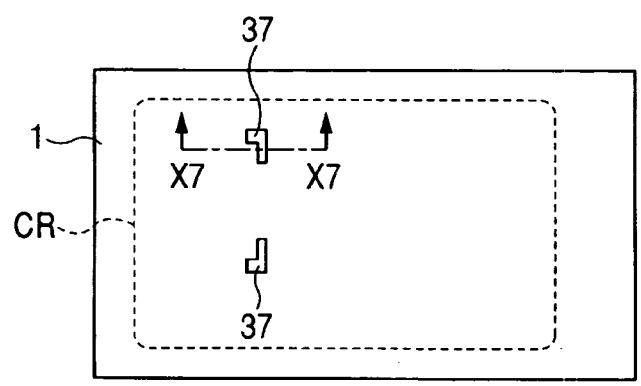
FIG. 89 is a plane view of an essential portion of a card board in a step of fabricating an IC card according to still other embodiment of the invention.
Figure 90:
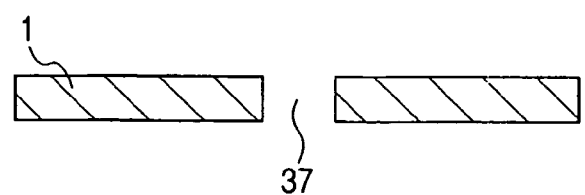
FIG. 90 is a sectional view taken along a line X7-X7 of FIG. 89.

FIG. 88 discloses a step of forming the recess portion 4c by jigs 35A, 35B formed by dies or the like. Here, the recess portion 4c is formed by a pressing force of the jig 35A. In this way, by forming the recess by the jig 35A, when there is formed a shape of, for example, the shape of the recess portion 4c in which the bottom portion of the recess is skewed, in comparison with the case of using the numerical control machine tool, the step can be finished in a short period of time, and there is achieved an advantage mounting to a reduction in fabrication cost. Further, although when the recess portion is formed by the jig 35A, since the jig 35A is pressed from an upper side, there is a case of forming an unnecessary projected portion 36 at a face on a side opposed to the side of forming the recess portion 4c as shown by FIG. 88, such a projected portion 36 can easily be removed by cutting by the numerical control machine tool which is carried out thereafter.

Figure 91:
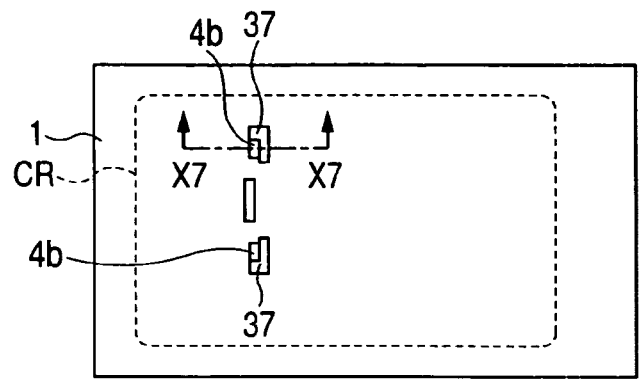
FIG. 91 is a plane view of an essential portion of a card board in a step of fabricating an IC card continued from FIG. 89.
Figure 92:
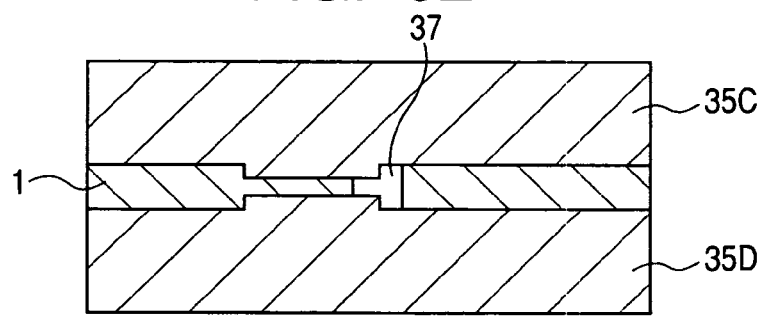
FIG. 92 is a sectional view taken along a line X7-X7 of FIG. 91.
Figure 93:
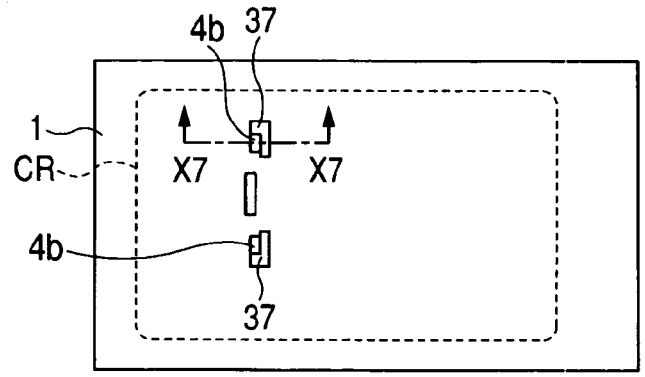
FIG. 93 is a plane view of an essential portion of a card board in a step of fabricating an IC card continued from FIG. 91.
Figure 94:
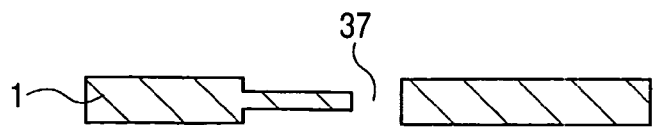
FIG. 94 is a sectional view taken along a line X7-X7 of FIG. 93.

FIG. 89 through FIG. 94 disclose working of recessing a portion of a card from both faces thereof by punching, crushing by a jig formed by a die or the like. In the working of forming the recess portion by deforming the card by dies, in comparison with cutting, a volume of the card is maintained and therefore, movement of the volume of the resin in correspondence with the recess portion which is intended to be formed is brought about. In steps shown in FIG. 89 through FIG. 94, a space 37 for receiving movement of the volume brought about in crushing by jigs 35C, 35D exemplified in FIG. 91, FIG. 92 is ensured by punching exemplified in FIG. 89, FIG. 90. Thereby, in being subjected to crushing, an unnecessary projection is prevented from being formed at card surfaces (first main face and second main face) to facilitate a shape working step thereafter.

In pressing by a die, by heating the die by a heater or the like, or applying an ultrasonic wave to the die, softening of the card comprising a thermoplastic resin can be promoted and the step time can also be shortened.

Further, although, for example, in Embodiments 1 through 4 and 6, an explanation has been given of a case of forming one IC card main body at one IC card, the invention is not limited thereto but a plurality of IC card main bodies may be formed at one IC card.

Further, the material of the board main body of the wiring board 8 of the IC portion 7 is not limited to glass epoxy species resin but, for example, polyimide species resin having a flexibility higher than that of glass epoxy species resin may be used.

An effect achieved by a representative one of the embodiments disclosed by the application is simply explained as follows.

That is, the function of the IC card can be promoted.

INDUSTRIAL APPLICABILITY

As described above, the IC card according to the invention is suitable for being used as record media of a portable type information apparatus requesting transportability as in a digital camera, a notebook type personal computer, a portable type music player, a portable telephone or the like other than various fields of finance, transportation, communication, delivery and acknowledgement or the like as in, for example, a credit card, a cash card, a card for ETC system, a commutation pass, a card for public telephone, a card for a portable telephone, or an acknowledgment card or the like.

The invention claimed is:

1. A method of fabricating an IC card characterized in comprising the following steps:
   (a) a step of preparing a card board having a plurality of card regions and printed with first information at a first main face of each of a plurality of card regions, a second main face on an opposed side thereof or the two main faces;
   (b) a step of forming a recess portion at the first main face of each of the plurality of card regions;
   (c) a step of forming a recess portion at the second main face of each of the plurality of card regions;

(d) a step of cutting out each of the plurality of card regions from the card board;

(e) a step of fixing an IC portion including an IC chip having a memory function, a calculating function, and a control function to the recess portion formed at the second main face of a cap portion of each of the plurality of card regions;

(f) a step of writing a desired data to the IC chip; and (g) a step of forming an opening portion penetrating the first main face and the second main face of the card board at a portion of the card board at a surrounding of the cap portion such that the cap portion is held in a state of being hung by the card board by way of a connecting portion.

2. The method of fabricating an IC card according to claim 1, wherein the (a) step is characterized in that the (a) step comprises the following steps:

(a1) a step of printing the first information to a printing sheet; and (a2) a step of cutting the printing sheet printed with the first information for each unit region; and (a3) a step of forming the card board by laminating the unit region(s) of the printing sheet on a first main face of a card base member, a second main face on an opposed side thereof or on the two main faces and thereafter bringing the unit region of the printing sheet and the card base member into press contact with each other.

3. The method of fabricating an IC card according to claim 2, characterized in that a printing method of the (a1) is an offset printing method.

4. The method of fabricating an IC card according to claim 2, characterized in that the card base member is harder than the printing sheet.

5. The method of fabricating an IC card according to claim 1, characterized in that the first information is common information common to a plurality of the IC cards.

6. The method of fabricating an IC card according to claim 1, characterized in further comprising:

(h) a step of printing second information constituting identification information which differs by a plurality of the respective IC cards at the first main face, the second main face or the two main faces of each of the plurality of card regions.

7. The method of fabricating an IC card according to claim 6, characterized in that the identification information is printed by a thermally transcribing method, a laser drawing method, embossing or a method compounded with two or more kinds thereof.

8. The method of fabricating an IC card according to claim 1, characterized in that in the (b) step and the (c) step, the recess portions are formed by milling using an end mill.

9. The method of fabricating an IC card according to claim 1, characterized in further comprising before the (d) step:

(i) a step of forming a positioning portion for matching positions of the card board and an IC card fabricating apparatus at the card region.

10. The method of fabricating an IC card according to claim 9, characterized in the positioning portion is formed at the (b) step, the (c) step or the both steps.

11. The method of fabricating an IC card according to claim 9, characterized in that the positioning portion is formed by a hole penetrating the first main face and the second main face of the card board, or the recess portion(s) formed at the first main face of the card board, the second main face or the two main faces.

12. The method of fabricating an IC card according to claim 1, characterized in that the (d) step is carried out after the (b) step and the (c) step.

13. The method of fabricating an IC card according to claim 1, characterized in that the connecting portion of the (g) step is formed at a position which is not brought into contact with a guide portion in mounting an IC card main body of a desired electronic apparatus when the IC card main body including the IC portion and the cap portion is cut to be separated from the IC card to be mounted to the desired electronic apparatus.

14. A method of fabricating an IC card characterized in comprising the following steps:

(a) a step of preparing a card board printed with first information at a first main face, a second main face on an opposed side thereof or the two main faces of a card region;

(b) a step of forming a recess portion at the first main face of the card region;

(c) a step of forming a recess portion at the second main face the card region;

(d) a step of cutting out the card region from the card board;

(e) a step of printing second information to the first main face, the second main face or the two main faces of the card region;

(f) a step of fixing an IC portion including an IC chip having a memory function, a calculating function and a control function to the recess portion formed at a cap portion of the second main face of the card region;

(g) a step of writing a desired data to the IC chip; and (h) a step of forming an opening portion penetrating the first main face and the second main face of the card board at a portion of the card board at a surrounding of the cap portion such that the cap portion is held in a state of being hung by the card board by way of a connecting portion.

15. An IC card characterized in comprising the following constitution characterized in comprising:

(a) a frame member portion; and (b) an IC card main body mounted to inside of a frame of the frame member portion in a state of being hung by way of a connecting portion;

wherein the IC card main body comprises a cap portion connected with the connecting portion, an IC portion, and a card side portion formed in parallel with a direction of inserting the IC card;

wherein the IC portion comprises an IC chip having a memory function, a calculating function and a control function, and a wiring board for mounting the IC chip, the IC portion being fixed to a recess portion of a second main face of the cap portion; and wherein the connecting portion is connected to a position of the IC card main body other than the card side portion.

16. The IC card according to claim 15, characterized in that the frame member portion and the cap portion are constructed by a constitution of laminating a card base member and a printing sheet(s) laminated to a first main face of the card base member, the second main face on an opposed side thereof or the two main faces.

17. The IC card according to claim 16, characterized in that the card base member is harder than the printing sheet.

* * * * *